United States Patent
Yadmellat et al.

(10) Patent No.: US 11,300,959 B2
(45) Date of Patent: Apr. 12, 2022

(54) SYSTEM AND METHOD FOR PREDICTIVE PATH PLANNING IN AUTONOMOUS VEHICLES

(71) Applicants: Peyman Yadmellat, North York (CA); Mohsen Rohani, Gatineau (CA)

(72) Inventors: Peyman Yadmellat, North York (CA); Mohsen Rohani, Gatineau (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 271 days.

(21) Appl. No.: 16/557,368

(22) Filed: Aug. 30, 2019

(65) Prior Publication Data
US 2021/0064040 A1 Mar. 4, 2021

(51) Int. Cl.
*G01C 22/00* (2006.01)
*G05D 1/02* (2020.01)
*G07C 5/02* (2006.01)
*H03H 17/02* (2006.01)
*G05D 1/00* (2006.01)

(52) U.S. Cl.
CPC ............. *G05D 1/0212* (2013.01); *G07C 5/02* (2013.01); *G05D 1/0088* (2013.01); *H03H 17/02* (2013.01)

(58) Field of Classification Search
CPC ...... G05D 1/0212; G05D 1/0088; G07C 5/02; H03H 17/02
USPC ............ 701/101, 25, 102, 17, 23, 41, 56, 60
See application file for complete search history.

(56) References Cited

U.S. PATENT DOCUMENTS

| | | | |
|---|---|---|---|
| 2008/0027591 A1* | 1/2008 | Lenser | G05D 1/0251 701/2 |
| 2018/0339710 A1* | 11/2018 | Hashimoto | B60W 40/04 |
| 2020/0409387 A1* | 12/2020 | Tsurumi | G06K 9/4604 |

FOREIGN PATENT DOCUMENTS

| | | |
|---|---|---|
| CN | 107577231 A | 1/2018 |
| WO | 2018163856 A1 | 9/2018 |

OTHER PUBLICATIONS

Paden, B., Čáp, M., Yong, S. Z., Yershov, D., & Frazzoli, E. (2016). A survey of motion planning and control techniques for self-driving urban vehicles. IEEE Transactions on intelligent vehicles, 1(1), 33-55 2016.

(Continued)

*Primary Examiner* — Hung Q Nguyen
*Assistant Examiner* — Anthony Donald Taylor, Jr.

(57) ABSTRACT

A processor-implemented method and system for determining a predictive occupancy grid map (OGM) for an autonomous vehicle are disclosed. The method includes: receiving a set of OGMs including a current predicted OGM and one or more future predicted OGMs, the current OGM associated with a current timestamp and each future predicted OGM associated with a future timestamp; generating a weight map associated with the current timestamp based on one or more kinodynamic parameters of the vehicle at the current time stamp, and one or more weight map associated with a future timestamp; generating a set of filtered predicted OGMs by filtering the current predicted OGM with the weight map associated the current timestamp and filtering each respective future predicted OGM associated with a future timestamp with the weight map associated with the respective future timestamp; and sending a single predicted OGM to a trajectory generator.

23 Claims, 11 Drawing Sheets

(56) References Cited

OTHER PUBLICATIONS

Werling, M., Ziegler, J., Kammel, S., & Thrun, S. (May 2010). Optimal trajectory generation for dynamic street scenarios in a frenet frame. In Robotics and Automation (ICRA), 2010 IEEE International Conference on (pp. 987-993). IEEE. 2010.

Ardiyanto, I., & Miura, J. (May 2012). 3D time-space path planning algorithm in dynamic environment utilizing Arrival Time Field and Heuristically Randomized Tree. In Robotics and Automation (ICRA), 2012 IEEE International Conference on (pp. 187-192). IEEE. 2012.

Foka, A. F., & Trahanias, P. E. (Oct. 2003). Predictive control of robot velocity to avoid obstacles in dynamic environments. In Intelligent Robots and Systems, 2003.(IROS 2003). Proceedings. 2003 IEEE/RSJ International Conference on (vol. 1, pp. 370-375). IEEE. 2003.

Foka, A. F., & Trahanias, P. E. (2002). Predictive autonomous robot navigation. In Intelligent Robots and Systems, 2002. IEEE/RSJ International Conference on (vol. 1, pp. 490-495). IEEE. 2002.

Hu, X., Chen, L., Tang, B., Cao, D., & He, H. (2018). Dynamic path planning for autonomous driving on various roads with avoidance of static and moving obstacles. Mechanical Systems and Signal Processing, 100, 482-500. 2018.

Xu, W., Pan, J., Wei, J., & Dolan, J. M. (May 2014). Motion planning under uncertainty for on-road autonomous driving. In Robotics and Automation (ICRA), 2014 IEEE International Conference on (pp. 2507-2512). IEEE. 2014.

Mouad, M., Adouane, L., Khadraoui, D., & Martinet, P. (Sep. 2012). Mobile robot navigation and obstacles avoidance based on planning and re-planning algorithm. In 10th International IFAC Symposium on Robot Control (SYROCO'12). 2012.

\* cited by examiner

1000

1010 receiving a set of predicted Occupancy Grid Maps (OGMs), the set of predicted OGMs including a current predicted OGM and one or more future predicted OGMs, the current OGM associated with a current timestamp and each future predicted OGM associated with a future timestamp 1020 generating a weight map associated with the current timestamp based on one or more kinodynamic parameters of the vehicle at the current time stamp, and one or more weight map associated with a future timestamp based on one or more kinodynamic parameters of the vehicle at the respective future timestamp 1030 generating a set of filtered predicted OGMs by filtering the current predicted OGM with the weight map associated the current timestamp and filtering each respective future predicted OGM associated with a future timestamp with the weight map associated with the respective future timestamp 1040 sending a single predicted OGM representative of set of filtered predicted OGMs to a trajectory generator, the single predicted OGM generated by combining the filtered predicted OGMs in the set of filtered OGMs 1050 generate a trajectory based on the single predicted OGM

FIG. 10

SYSTEM AND METHOD FOR PREDICTIVE PATH PLANNING IN AUTONOMOUS VEHICLES

FIELD

The present disclosure relates to systems and methods for path planning for autonomous vehicles. Specifically, the present disclosure relates to systems and method for path planning using occupancy grid maps.

BACKGROUND

An autonomous vehicle may use different sensors to sense its surrounding environment and vehicle operating parameters, a state estimation system to determine a state of the vehicle based on the sensed environment and vehicle operating parameters, a planning system to plan future vehicle actions based on target objectives and the vehicle state, a vehicle control system for translating the planned future action into control commands, and an electromechanical system for implementing the control commands. Of these systems, the planning system plays a crucial role in decision making, planning, and navigation.

The planning system conventionally includes a behavioral planner (BP) and a motion planner or motion planning module (MoP). Motion planning in autonomous vehicles, such as ground, aerial, surface, and underwater autonomous vehicles, is typically done by generating a trajectory based on state information for a controller to follow. Standard approaches use explicit cost functions as rules for ranking candidate trajectories for selection. The motion planning module is responsible for generating a safe, feasible, and smooth trajectory from the current state of the vehicle to a target state provided by upstream modules in the planning system (e.g. the BP). As an example, in the context of autonomous vehicles, the current state is the current position and orientation of the vehicle, and target state can be a center point within a lane a few meters ahead. The generated trajectory is then fed to a vehicle control system to control the vehicle to follow the given trajectory.

Information collected from the sensors is provided as sensor data by the various sensors to the planning system of the autonomous vehicle which uses the sensor data for path planning and navigation of the autonomous vehicle. In order to efficiently plan a path and safely navigate an autonomous vehicle in any environment, it is important to have information about the position of any objects (both static and moving objects) in the environment. Occupancy Grid Maps (OGMs) are commonly used to represent the environment surrounding an autonomous vehicles. Each OGM is generated based on sensor data received from the various different sensors included in or mounted on an autonomous vehicle.

For various reasons (e.g., sensor noise), sensor data from the various different sensors may include uncertainties or ambiguities, and the observations constructed based on these sensor data may not be fully clear. Therefore, the value contained in each cell is a value, typically between 0 and 1, that corresponds to how likely the cell is occupied by an object. The autonomous vehicle can use the OGM (e.g., as input for path planning) to determine a path for the autonomous vehicle to reach to a certain target or sweep a certain area inside the environment, for example. However, a single OGM may represent the environment at a given time (specifically, a time at which the observations were obtained by the sensors). Therefore, the path planning performed using the OGM may be valid only if it is assumed that the objects in the environment are static. This assumption does not hold for an environment in which objects are moving (referred to as "a dynamic environment") and particularly in a dynamic environment where the moving objects do not necessarily follow a predefined trajectory (referred to as a "dynamic, unstructured environment").

The environment in which an autonomous vehicle operates is usually a dynamic, unstructured environment. One way to cope with such an environment is to keep updating the current OGM each time sensor data is received from a sensor of the vehicle and then update the planned path accordingly. However, this approach will result in frequent modifications to the autonomous vehicles planned trajectory, which may be unsafe and/or may require many unnecessary steering corrections. Another approach is to enlarge representations of dynamical objects represented in the current OGM to account for their movement. In this approach, the cells surrounding objects are assumed to also be occupied, and path planning is performed based on the "enlarged" OGM. A difficulty with this approach is to how determine which of the cells surrounding objects are assumed to be occupied. Also, such an approach may not be suitable in a tight environment because otherwise free spaces that can be used would be blocked by the enlarged object representations in the OGM.

Efficient motion planning is a challenging task in autonomous vehicles. The complexity increases for dynamic environments. When the motion planning module is required to determine trajectories for an autonomous vehicle in such environments, the motion planning module needs to perform a significant amount of computation when determining a suitable trajectory for the autonomous vehicle in such environments. A three-dimensional (3D) spatiotemporal planning method or a padding method may be utilized by a motion planning module to reduce the amount of computations required when determining a suitable trajectory for an autonomous vehicle. The basic idea behind the padding method is to expand the bounding boxes of moving objects to account for changes in the dynamic environment. Padding-based methods generally result in a conservative trajectory and may require velocity estimation for all of the objects present in the dynamic environment. In 3D spatiotemporal planning methods, a common approach is to augment a predicted environment at every timestamp to create a 3D spatiotemporal space. The trajectories are then generated in 3D space. Such methods typically require the planning system to handle a high computational complexity, which is required to perform time-constrained path planning in 3D space, dynamic (e.g., time-varying) optimization, and velocity-depended 3D space. Moreover, in these approaches, the path planning method often needs to be implemented and executed with 3D space generation methods to ensure casualty and feasibility, which limits the choice of path planning methods for dynamic environments.

There is a need for a method for path planning in autonomous vehicles that can efficiently address challenges in representing dynamic objects in a real-world environment for navigation of autonomous vehicles in such environments.

SUMMARY

According to example aspects, the present disclosure provides methods and system for hierarchical planning in autonomous vehicles.

In accordance with one aspect, there is provided a processor-implemented method for generating a single predicted 2D occupancy grid map (OGM) for an autonomous vehicle is disclosed. The method includes the steps of: receiving a set of predicted occupancy grid map (OGMs), the set of predicted OGMs including a current predicted OGM and one or more future predicted OGMs, the current OGM associated with a current timestamp and each future predicted OGM associated with a future timestamp; generating a weight map associated with the current timestamp based on one or more kinodynamic parameters of the vehicle at the current time stamp, and one or more weight map associated with a future timestamp based on one or more kinodynamic parameters of the vehicle at the respective future timestamp; generating a set of filtered predicted OGMs by filtering the current predicted OGM with the weight map associated the current timestamp and filtering each respective future predicted OGM associated with a future timestamp with the weight map associated with the respective future timestamp; and sending a single predicted OGM representative of the set of filtered predicted OGMs to a trajectory generator, the single predicted OGM generated by combining the filtered predicted OGMs in the set of filtered OGMs.

In some aspects, filtering the respective predicted OGM in the set of predicted OGMs includes a Gaussian filtering operation or a Bayesian filtering operation.

In some aspects, the method includes generating a set of area of interest maps based on a behaviour command received from a behaviour planning module, the set of area of interest maps may include a current area of interest map associated with the current timestamp and one or more future area of interest maps, each future area of interest map associated with a respective future timestamp.

In some aspects, the method includes filtering the current predicted OGM associated the current timestamp with the current area of interest map and filtering each respective future predicted OGM associated with a future timestamp with the area of interest map associated with the respective future timestamp.

In some aspects, the method includes, prior to generating the set of filtered predicted OGMs, filtering the weight map associated with the current timestamp with the current area of interest map and filtering each respective weight map associated with a future timestamp with the area of interest map associated with the respective future timestamp.

In some aspects, the method includes filtering the filtered predicted OGM associated with the current timestamp with the current area of interest map and filtering each respective filtered predicted OGM associated with a future timestamp with the area of interest map associated with the respective future timestamp.

In some aspects, the method includes generating a trajectory based on the single predicted OGM.

In some aspects, each of the set of weight maps has a respective weight region associated with the corresponding timestamp, the weight region may be constructed to represent a maximum area the vehicle can reach with a margin of safety at the corresponding timestamp, and the weight region may be calculated based on a maximum feasible speed and acceleration of the vehicle.

In some aspects, the one or more kinodynamic parameters may include at least one of: a linear speed, an acceleration or deceleration, a travel direction, an angular acceleration, pitch, yaw, roll, vibration, an engine RPM, a throttle position, a brake position, a transmission gear ratio, a maximum rotation speed of the steering wheel of the vehicle, a kinematic model of the vehicle, a width of the vehicle, a length of the vehicle, and a minimum turning radius.

In accordance with another aspect, there is provided a system for generating a predictive occupancy grid map (OGM) for an autonomous vehicle is disclosed. The system includes a processing unit configured to execute instructions to: receive a set of predicted occupancy grid map (OGMs), the set of predicted OGMs including a current predicted OGM and one or more future predicted OGMs, the current OGM associated with a current timestamp and each future predicted OGM associated with a future timestamp; generate a weight map associated with the current timestamp based on one or more kinodynamic parameters of the vehicle at the current time stamp, and one or more weight map associated with a future timestamp based on one or more kinodynamic parameters of the vehicle at the respective future timestamp; generate a set of filtered predicted OGMs by filtering the current predicted OGM with the weight map associated the current timestamp and filtering each respective future predicted OGM associated with a future timestamp with the weight map associated with the respective future timestamp; and send a single predicted OGM representative of the set of filtered predicted OGMs to a trajectory generator, the single predicted OGM generated by combining the filtered predicted OGMs in the set of filtered OGMs.

In some aspects, filtering the respective predicted OGM in the set of predicted OGMs includes a Gaussian filtering operation or a Bayesian filtering operation.

In some aspects, the processing unit is configured to execute instructions to generate a set of area of interest maps based on a behaviour command received from a behaviour planning module, and the set of area of interest maps may include a current area of interest map associated with the current timestamp and one or more future area of interest maps, and each future area of interest map may be associated with a respective future timestamp.

In some aspects, the processing unit is configured to execute instructions to: filter the current predicted OGM with the current area of interest map associated the current timestamp and filter each respective future predicted OGM associated with a future timestamp with the area of interest map associated with the respective future timestamp.

In some aspects, the processing unit is configured to execute instructions to: prior to generation of the set of filtered predicted OGMs, filter the weight map associated with the current timestamp with the current area of interest map associated the current timestamp and filter each respective weight map associated with a future timestamp with the area of interest map associated with the respective future timestamp.

In some embodiments, the processing unit is configured to execute instructions to: filter the filtered predicted OGM associated with the current timestamp with the current area of interest map and filter each respective filtered predicted OGM associated with a future timestamp with the area of interest map associated with the respective future timestamp.

In some embodiments, each of the set of weight maps has a respective weight region associated with the corresponding timestamp, the weight region may be constructed to represent a maximum area the vehicle can reach with a margin of safety at the corresponding timestamp, and the weight region may be calculated based on a maximum feasible speed and acceleration of the vehicle.

In some embodiments, the one or more kinodynamic parameters may include at least one of: a linear speed, an acceleration or deceleration, a travel direction, an angular acceleration, pitch, yaw, roll, vibration, an engine RPM, a throttle position, a brake position, a transmission gear ratio, a maximum rotation speed of the steering wheel of the vehicle, a kinematic model of the vehicle, a width of the vehicle, a length of the vehicle, and a minimum turning radius.

In accordance with another aspect, there is provided a non-transitory computer-readable medium storing instructions is provided. The instructions, when executed by a processor of an autonomous vehicle, cause the processor of the vehicle to: receive a set of predicted occupancy grid map (OGMs), the set of predicted OGMs including a current predicted OGM and one or more future predicted OGMs, the current OGM associated with a current timestamp and each future predicted OGM associated with a future timestamp; generate a weight map associated with the current timestamp based on one or more kinodynamic parameters of the vehicle at the current time stamp, and one or more weight map associated with a future timestamp based on one or more kinodynamic parameters of the vehicle at the respective future timestamp; generate a set of filtered predicted OGMs by filtering the current predicted OGM with the weight map associated the current timestamp and filtering each respective future predicted OGM associated with a future timestamp with the weight map associated with the respective future timestamp; and send a single predicted OGM representative of the set of filtered predicted OGMs to a trajectory generator, the single predicted OGM generated by combining the filtered predicted OGMs in the set of filtered OGMs.

In some aspects, the instructions, when executed by a processor of an autonomous vehicle, may cause the processor of the vehicle to generate a set of area of interest maps based on a behaviour command received from a behaviour planning module, the set of area of interest maps may include a current area of interest map associated with the current timestamp and one or more future area of interest maps, each future area of interest map may be associated with a respective future timestamp.

In some aspects, the instructions, which when executed by a processor of an autonomous vehicle, may cause the processor of the vehicle to: filter the current predicted OGM associated the current timestamp with the current area of interest map and filter each respective future predicted OGM associated with a future timestamp with the area of interest map associated with the respective future timestamp.

In some aspects, the instructions, which when executed by a processor of an autonomous vehicle, may cause the processor of the vehicle to: filter the weight map associated with the current timestamp with the current area of interest map and filter each respective weight map associated with a future timestamp with the area of interest map associated with the respective future timestamp.

In some aspects, the instructions, which when executed by a processor of an autonomous vehicle, may cause the processor of the vehicle to: filter the filtered predicted OGM associated with the current timestamp with the current area of interest map and filter each respective filtered predicted OGM associated with a future timestamp with the area of interest map associated with the respective future timestamp.

In some aspects, each of the set of weight maps has a respective weight region associated with the corresponding timestamp, the weight region being constructed to represent a maximum area the vehicle can reach with a margin of safety at the corresponding timestamp, and the weight region is calculated based on a maximum feasible speed and acceleration of the vehicle.

BRIEF DESCRIPTION OF THE DRAWINGS

Reference will now be made, by way of example, to the accompanying drawings which show example embodiments of the present application, and in which:

FIG. 10 is a flowchart illustrating an example method for processing a set of predicted OGMs to generate a final OGM and a trajectory based on the final OGM.

Similar reference numerals may have been used in different figures to denote similar components.

DESCRIPTION OF EXAMPLE EMBODIMENTS

Some examples of the present disclosure are described in the context of autonomous vehicles. Although examples described herein may refer to a car as the autonomous vehicle, the teachings of the present disclosure may be implemented in other forms of autonomous or semi-autonomous vehicles including, for example, trams, subways, trucks, buses, surface and submersible watercraft and ships, aircraft, drones (also referred to as unmanned aerial vehicles (UAVs)), warehouse equipment, manufacturing facility equipment, construction equipment, farm equipment, autonomous service robots such as vacuum cleaners and lawn mowers, and other robotic devices. Autonomous vehicles may include vehicles that do not carry passengers as well as vehicles that do carry passengers.

Autonomous navigation for a vehicle such as an autonomous vehicle operating in a dynamic environment requires at least two steps: a) predicting the movements of dynamic and static objects; and b) generating collision-free trajectory or trajectories for the vehicle based on the predicted movements. Predicting movements of dynamic objects in an environment are often represented using a set of predicted occupancy grid maps (OGMs), which are generated by predicting future changes to a current OGM, over time.

Figure 1:
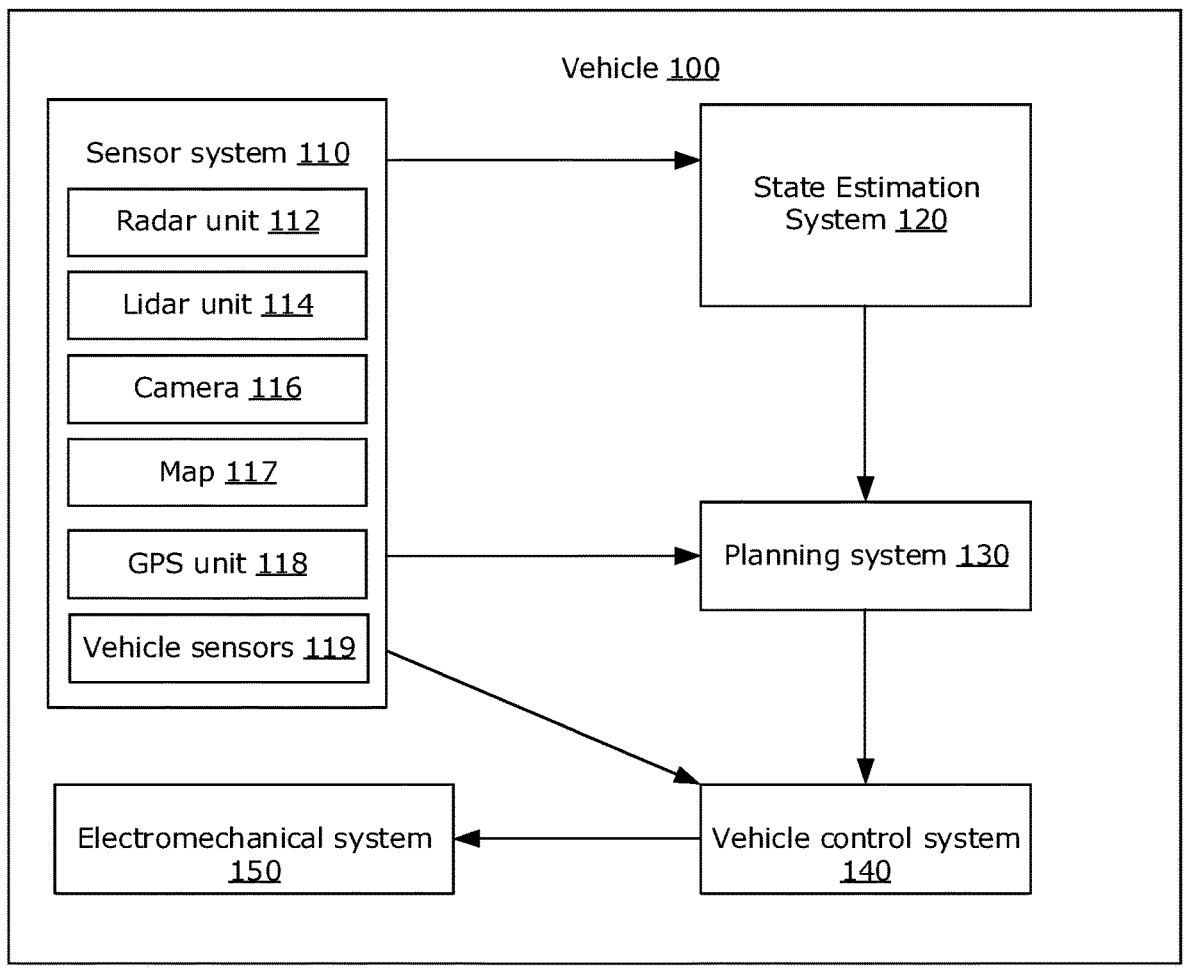
FIG. 1 is a block diagram illustrating some components of an example autonomous vehicle.

FIG. 1 is a block diagram illustrating certain components of an example autonomous vehicle 100. Although described as being autonomous, the vehicle 100 may be operable in a fully-autonomous, semi-autonomous or fully user-controlled mode. In the present disclosure, the vehicle 100 is described in the embodiment of a car, however the present disclosure may be implemented in other autonomous vehicles, as discussed above.

The vehicle 100 includes a sensor system 110, a state estimation system 120, a planning system 130, a vehicle control system 140 and an electromechanical system 150, for example. Other systems and components may be included in the vehicle 100 as appropriate. The state estimation system 120, the planning system 130, and the vehicle control system 140 in this example are distinct software systems that include machine readable instructions may be executed by one or processors of a processing system of the vehicle. Alternatively, the state estimation system 120, the planning system 130, and the vehicle control system 140 may be distinct systems on chip (e.g., application-specific integrated circuit (ASIC), field-programmable gate array (FGPA), and/or other type of chip). For example, the state estimation system 120, the planning system 130, and the vehicle control system 140 may be implemented using one chip, two chips, or three distinct chips (using the same or different types of chips). Various systems and components of the vehicle may communicate with each other, for example through wired or wireless communication. For example, the sensor system 110 may communicate with the state calculation system 120, the planning system 130 and the vehicle control system 140; state estimation system 120 may communicate with the planning system 130 and the vehicle control system 140; the planning system 130 may communicate with the vehicle control system 140; and the vehicle control system 140 may communicate with the electromechanical system 150.

Referring again to FIG. 1 example flows of data (indicated by arrows) from the sensor system 110 to the state estimation system 120, to the planning system 130, to the vehicle control system 140, and to the electromechanical system 150 (discussed in further detail below) are illustrated. However, it should be understood that data may be communicated among the systems 110, 120, 130, 140, 150 in various different ways, and there may be two-way data communication among the systems 110, 120, 130, 140, 150.

The sensor system 110 includes various sensing units, such as a radar unit 112, a LIDAR unit 114, and a camera 116, for collecting information about an environment surrounding the vehicle 100 as the vehicle 100 operates in the environment. The sensor system 110 also includes a global positioning system (GPS) unit 118 for collecting information about a location of the vehicle in the environment.

The sensor system 110 provides information collected about an environment surrounding the vehicle 100 and the information collected about the location of the vehicle 100 as sensor data to the state estimation system 120. The state estimation system 120 receives the sensor data and generates an estimated state of the vehicle based on the sensor data, which is an estimate of a current state of the vehicle. In example embodiments, the estimated vehicle state includes information including a vehicle location state, a vehicle environment state, and a vehicle operational state. Vehicle location state describes a position of the vehicle and may for example include absolute geographical longitude/latitudinal values and/or values that reference other frames of reference. Vehicle environment state describes the surrounding environment of the vehicle, including for example stationary and moving objects around the vehicle, weather and temperature conditions, road conditions, road configuration and other information about the physical environment that the vehicle operates in. Vehicle operational state describes physical operating conditions of the vehicle itself, including for example kinodynamic parameters such as linear speed and acceleration, travel direction, angular acceleration, pose (e.g. pitch, yaw, roll), and vibration, and mechanical system operating parameters such as engine RPM, throttle position, brake position, and transmission gear ratio, among other things. Generally, the term kinodynamics relates to a class of problems, in robotics and motion planning, in which velocity, acceleration, force/torque bounds must be satisfied and where kinematics constraints (e.g., obstacle avoidance) must also be satisfied. Kinodynamic parameters are those parameters, such as described above, that are relevant to this type of motion planning problem. In some embodiments, kinodynamic parameters may include one or more of: a maximum acceleration, a maximum deceleration, a maximum rotation speed of the steering wheel of the vehicle 100, a kinematic model of the vehicle 100, a width or length of the vehicle 100, a minimum turning radius, and so on.

In this regard, the sensor system 110 may also include vehicle sensors 119. Vehicle sensors 119 may include sensors for collecting information about the physical operating conditions of the vehicle 100, including for example sensors for sensing steering angle, linear speed, linear and angular acceleration, pose (pitch, yaw, roll), compass travel direction, vehicle vibration, throttle state, brake state, wheel traction, transmission gear ratio, cabin temperature and pressure, as well as external environment sensors for sensing things such as an external temperature and pressure, precipitation, and noise, among other possibilities. Vehicle sensors 119 provide the collected information about the physical operating conditions of the vehicle 100 as sensor data to the state estimation system 120, and may be used by the state estimation system 120 when generating an estimated state of the vehicle based on the sensor data.

The sensor system 110 also includes a map 117, which may be a reference map that represents known information about the surrounding environment. For example, the map 117 may be received from an external reference database (e.g., retrieved based on the vehicle's position, as determined using the GPS unit 118).

The state estimation system 120 receives sensor data from the sensor system 110 and uses the sensor data to generate the estimated vehicle state $S=\{S_l,S_e,S_o\}$, which as noted above includes a vehicle location state $S_l$, vehicle environment state $S_e$, and vehicle operational state $S_o$. For example, sensor data received from the radar, LIDAR and camera units 112, 114, 116 and sensor data received from other sensors may be used to determine the local environment of the vehicle 100 (e.g., any immediately surrounding obstacles) as well as information from a wider vicinity (e.g., the radar unit 112 and LIDAR unit 114 may collect information from an area of up to 100 m radius or more around the vehicle 100). Sensor data from GPS unit 118 and other sensors may be used to determine vehicle location state, defining a geographic position of the vehicle 100. Sensor data from vehicle sensors 119 and GPS unit 118, as well as from other sensor units, may be used to determine vehicle operational state $S_o$, including speed and pose of the vehicle 100 relative to a frame of reference.

Estimated vehicle state $S=\{S_l, S_e, S_o\}$ output from the state estimation system 120 based on sensor data received from the sensor system 110 is provided in real-time to the planning system 130, which is the focus of the current disclosure and will be described in greater detail below. The vehicle control system 140 serves to control operation of the vehicle 100 based on target objectives set by the planning system 130. The vehicle control system 140 may be used to provide full, partial or assistive control of the vehicle 100. The electromechanical system 150 receives control signals from the vehicle control system 140 to operate the electromechanical components of the vehicle 100 such as an engine, transmission, steering system and braking system.

Figure 2:
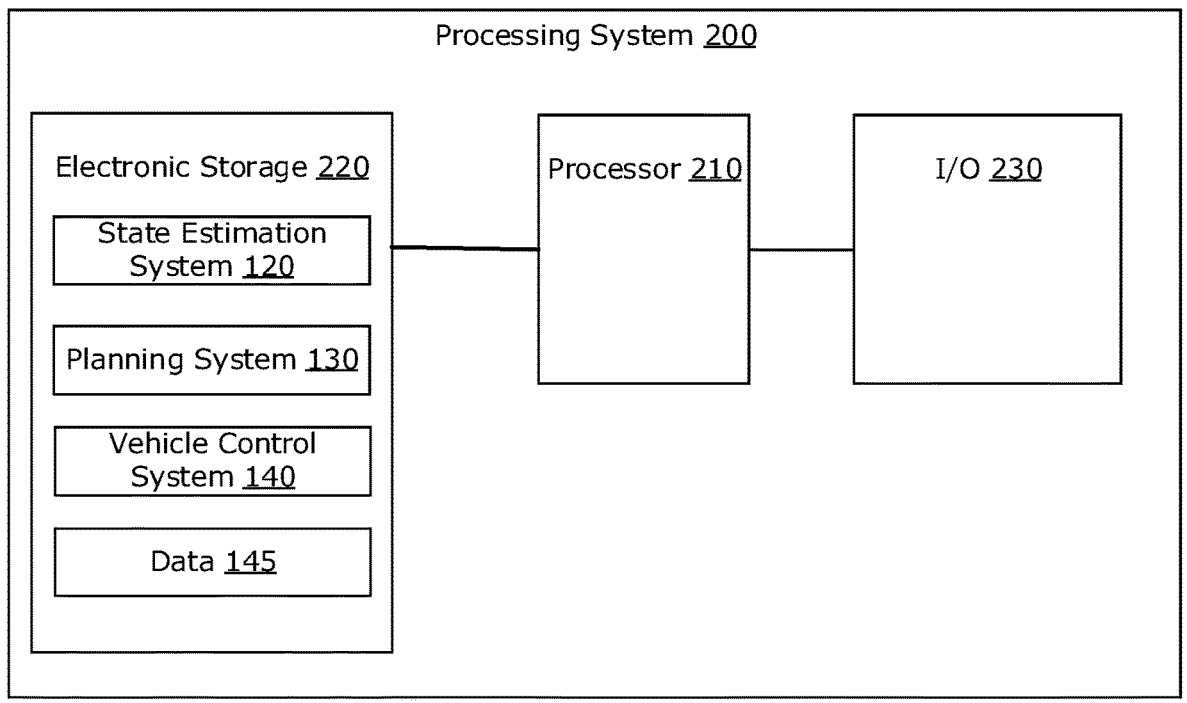
FIG. 2 is block diagram illustrating some components of a processing unit used to implement a planning system of the autonomous vehicle of FIG. 1 according to example embodiments.

The state estimation system 120, planning system 130 and the vehicle control system 140 may be implemented as software that includes machine readable instructions that are executable by one or more processing units of a processing system of the vehicle 100. By way of example, FIG. 2 shows illustrates an example of a processing system 200 of vehicle 100 that includes one or more processing units 210. The one or more processing unit 210 may be a central processing unit (CPU), a graphical processing unit (GPU), a tensor processing unit (TPU), a neural processing unit (NPU), a digital signal processor or other computational element. The one or more processing units 210 are coupled to electronic storage 220 and to one or more input and output interfaces or devices 230. The electronic storage 220 can include non-transient or tangible memory (for example flash memory) and transient memory (for example RAM). The tangible memory(ies) may store instructions, data and/or software modules for execution by the processor(s) 210 to carry out the functions of the systems described herein. The tangible memory(ies) of electronic storage 220 may store other software instructions and data for implementing other operations of the vehicle 100. Electronic storage 220 may include any suitable volatile and/or non-volatile storage and retrieval device(s), including for example flash memory, random access memory (RAM), read only memory (ROM), hard disk, optical disc, subscriber identity module (SIM) card, memory stick, secure digital (SD) memory card, and other state storage devices. In the example of FIG. 2, the electronic storage 220 of processing unit 200 stores the instructions of the state estimation system 120, the planning system 130, and the vehicle control system 140, respectively, which are executable by the processor 210. In some embodiments, the electronic storage 220 also stores data 145, including sensor data provided by the sensor system 110 and data utilized by the planning system 130 to generate a driving plan, such as maps for the current environment.

Figure 3:
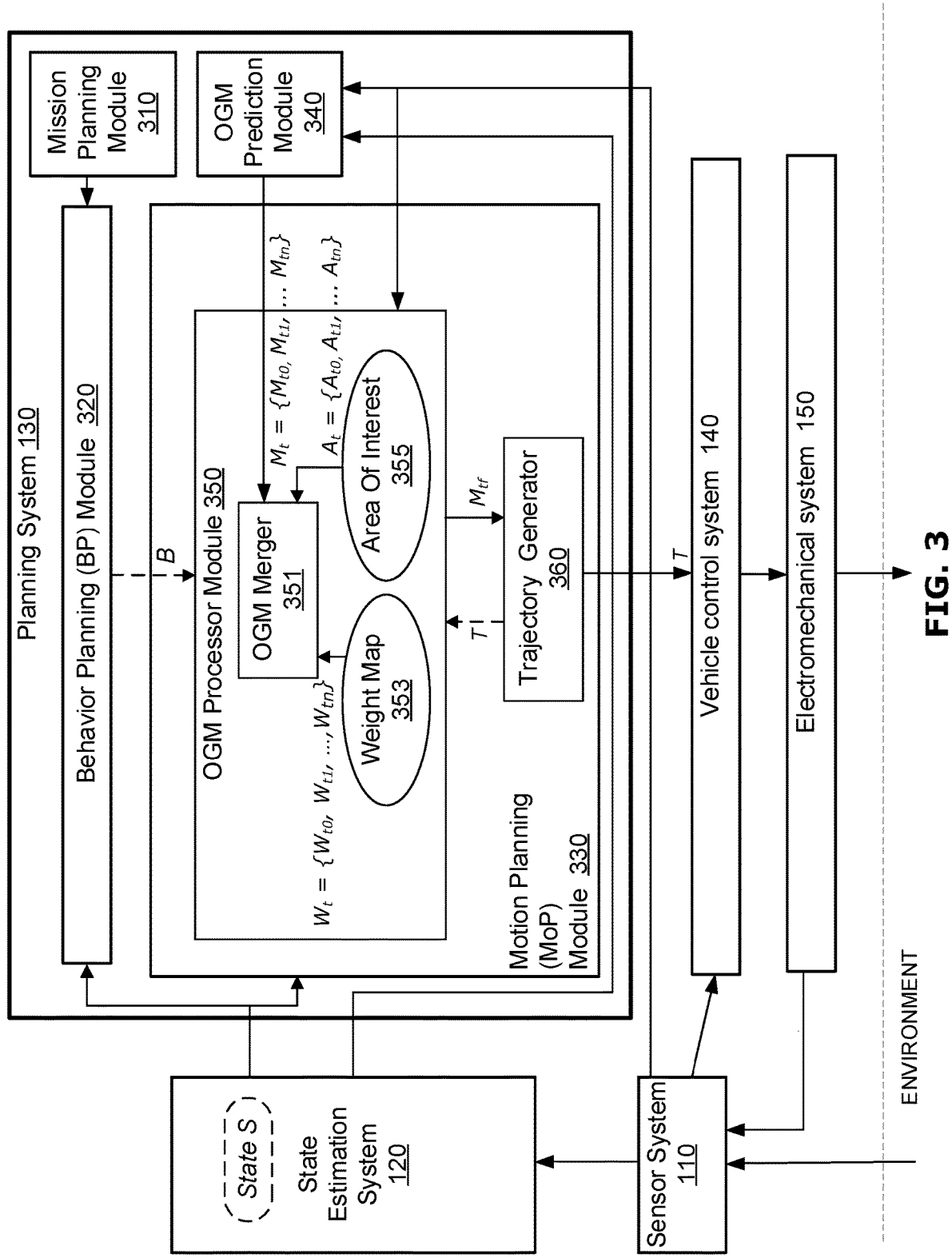
FIG. 3 is a block diagram showing logical components of a planning system according to an example embodiment.

FIG. 3 is a block diagram representation of a logical architecture of the planning system 130 and its interaction with other vehicle systems, according to example embodiments. According to example embodiments, the path planning system 130 is configured as a scalable, modular and extensible machine learning-based system for autonomous vehicles. The path planning system 130 may for example include, among other modules, a mission planning module 310, a behavior planning (BP) module 320, a motion planning (MoP) module 330, and an OGM prediction module 340. The present disclosure focuses on MoP module 330 of the path planning system 130.

Autonomous navigation for cars from point A to point B may include many driving sub-tasks and conditions that require different considerations such as: conformance to traffic rules; navigation in structured and unstructured roads; navigation in different types of roads; handling dynamic and static obstacles; dealing with different weather conditions, and so on. These myriad tasks and considerations can make it difficult to design an end-to-end planning system that generates a driving plan that deals with all types of scenarios, environments, and conditions. To this end, in example embodiments, planning system 130 is configured to provide a modular and extensible system that can deal with different driving sub-tasks and conditions, and is enabled to abstract road and driving area complexities to a more general state-action representation.

In the example of FIG. 3, BP module 320 is configured to output a vehicle behavior command or command B based on inputs that include mission information and estimated vehicle state S. The mission information, which may for example be received from a mission planning module 310, includes information that specifies (or which can be used to deduce) a target objective for the vehicle, for example "proceed to a target Point 'Y' within a target time 'X'". This target objective may be a sub-objective of a larger end objective, or may itself be an end objective. BP module 320 particularizes the target objective into an ongoing succession of vehicle behavior commands required to achieve the target objective. The determination of each vehicle behavior command B is based on the estimated vehicle state S as estimated by the state estimation system 120. The estimated vehicle state S is estimated by the state estimation system 120 based on sensor data received from the sensor system 110. The sensor system 110 makes real-time measurements and collects information about the current environment the vehicle 100 operates in and the physical operating conditions of the vehicle 100, and provides sensor data to the state estimation system 120. By way of non-limiting example, in order to achieve a target objective based on estimated vehicle state S, vehicle behavior command B may be selected from the following possible behaviors: Keep Lane; Change Lane—Left; Change Lane—Right; Proceed Around Obstacle; Proceed in Open Area; Park; Pull-over and Stop at Roadside; and so on.

The OGM prediction module 340 may be implemented in different ways. Other systems and components may be included in the vehicle 100 as appropriate. Various systems and components of the vehicle may communicate with each other, for example through wired or wireless communication. For example, the sensor system 110 may communicate with the OGM prediction module 340, path planning system 130 and the vehicle control system 140; the OGM prediction module 340 may communicate with the path planning system 130 and the vehicle control system 140; the path planning system 130 may communicate with the vehicle control system 140; and the vehicle control system 140 may communicate with the electromechanical system 150.

Occupancy grid maps (OGMs) are commonly used to represent the environment surrounding the vehicle 100. An OGM may be represented as a grid cell. Each cell represents a physical space in the environment, and each cell contains a value representing the probability of each cell being occupied by an object, based on information or observations regarding the vehicle 100 and its surrounding environment. For example, the path planning system 130 may include a module, such as the OGM prediction module 340, for generating a predicted OGM. Alternatively, the module for generating predicted OGMS may be included in processing system coupled to the path planning system 130.

The OGM prediction module 340 is configured to receive an input OGM (e.g., a current observed OGM), and to generate a set of predicted OGMS $M_r = \{M_{r0}, M_{r1}, \ldots M_{tn}\}$ based on the input OGM. Each predicted OGM in the set of predicted OGMs $\{M_{r0}, M_{r1}, \ldots M_{tn}\}$ is an OGM associated with the vehicle 100 predicted for a specific point in time t. For example, predicted OGM $M_{t0}$ represents a predicted OGM generated for t=$t_0$, where $t_0$ is the present. Predicted OPM $M_{t1}$ represents an OGM predicted for t=$t_1$, where $t_1$ represents a second after $t_0$, and so on. The OGM prediction module 340 is configured to generate a set of predicted OGMs $M_t$ based on a current observed OGM. In some cases, an OGM can be generated based on sensor data collected from different sensors on an autonomous vehicle. For example, sensor data from the radar, LIDAR and camera units 112, 114, 116, GPS unit 118 and other sensors may be used to generate a current observed OGM from which the OGM prediction module 340 generates a set of predicted OGMs $M_t=\{M_{t0}, M_{t1}, \ldots M_{tn}\}$. Estimated vehicle state S may also be used to generate the current observed OGM. In some cases, a current observed OGM can be generated based on one or more states generated by a state estimation system 120. The state estimation system 120 can generate the one or more states based on the sensor data collected from different sensors on an autonomous vehicle.

The software of the OGM prediction module 340 and MoP module 330 may be executed using a using the one or more processing units of the processing system 200 of the vehicle 100. The OGM prediction module 340 may repeatedly (e.g., in regular intervals) receive a current observed OGM generated from sensor data received from the sensor system 110 and generate a set of predicted OGMs from the current observed OGM in real-time or near real-time. The OGM prediction module 340 may also transmit the set of predicted OGMs to an OGM processor module 350 in the MoP module 330 for generating a final predicted OGM and a trajectory.

Data from the sensor system 110, estimated vehicle state S from the state estimation system 120, input behavior command B from the BP module 320, and a set of predicted OGMs $M_t$ from the OGM prediction module 340 may be provided to the MoP module 330. The MoP module 330 carries out path planning for the vehicle 100. For example, the MoP module 330 may plan a path or trajectory T for the vehicle 100 to travel from a starting point to a target destination. The MoP module 330 may be implemented as one or more software modules or control blocks comprising machine-readable instruction that are executed the one or more processing units of the processing system 200 of the vehicle 100. The output from the MoP module 330 may include data defining one or more planned paths for the vehicle 100 to travel. The path planning carried out by the planning system 130 is performed in real-time or near real-time, to enable the vehicle 100 to be responsive to real-time changes in the sensed environment. Output from the planning system 130 may be a trajectory T provided to the vehicle control system 140. In particular, MoP Module 330 plans and outputs the selected trajectory T required to implement the behavior command B in view of the estimated vehicle state S. The selected trajectory T is then used by the vehicle control system 140 to control vehicle operation by sending commands to the electromechanical system to implement the behavior, resulting in a new vehicle state, for which a new estimated state S is generated (using new sensed data) and fed back to the planning system 130.

As indicated in FIG. 3, in example embodiments, the MoP module 330 includes at least two sub-modules, namely, an OGM processor module 350 and a candidate trajectory generator 360. The OGM processor module 350 may be implemented as one or more software modules or control blocks carried out by one or more processing units in the vehicle 100. Data from the sensor system 110, input behavior command B from the BP module 320, and a set of occupancy grid maps $M_t$ from the OGM prediction module 340 may be provided to the OGM processor module 350 to generate a final, two-dimensional (2D) OGM $M_tf$. The final OGM $M_{tf}$ may be used by the trajectory generator 360 to generate a trajectory T. The trajectory generator 360 may use additional information such as estimated vehicle state S from the state estimation system 120 and behavior command B to generate the trajectory T. The OGM prediction module 340 receives sensor data from the sensor system 110, state information S from the state estimation system 120, and input behavior command B from the BP module 320 in order to determine current observed OGM and generate a set of predicted OGMs $M_t$ based on the current observed OGM.

The OGM processor module 350 is configured to merge the set of predicted OGMs $M_t$ into a final 2D predicted OGM $M_{tf}$, which is then used by the trajectory generator module 360 to generate one or more trajectories T for the vehicle 100. The method and system of the present disclosure lowers the computational complexity by reducing three-dimensional (3D) and time-constrained path planning problem to an efficient 2D path planning problem. In addition, because the generation of a final predicted 2D OGM $M_{tf}$ by the OGM processor module 350 is independent from the path planning algorithm implemented by the trajectory generator module 360, generation of the final predicted 2D OGM does not impose any limitations which path planning algorithm is utilized by the trajectory generator module 360.

In example embodiments, the OGM processor module 350 includes at least three sub-modules, namely, an OGM merger module 351, a weight map module 353, and an area of interest module 355. The OGM processor module 350 generates the final 2D OGM $M_{tf}$ by filtering or updating the given set of predicted OGMs $M_t$ based on a number of factors including one or more of: kinodynamic parameters of the vehicle 100, a behavior command B, various sensor data, estimated vehicle state S, and one or more trajectories T generated by the trajectory generator 360.

Figure 4:
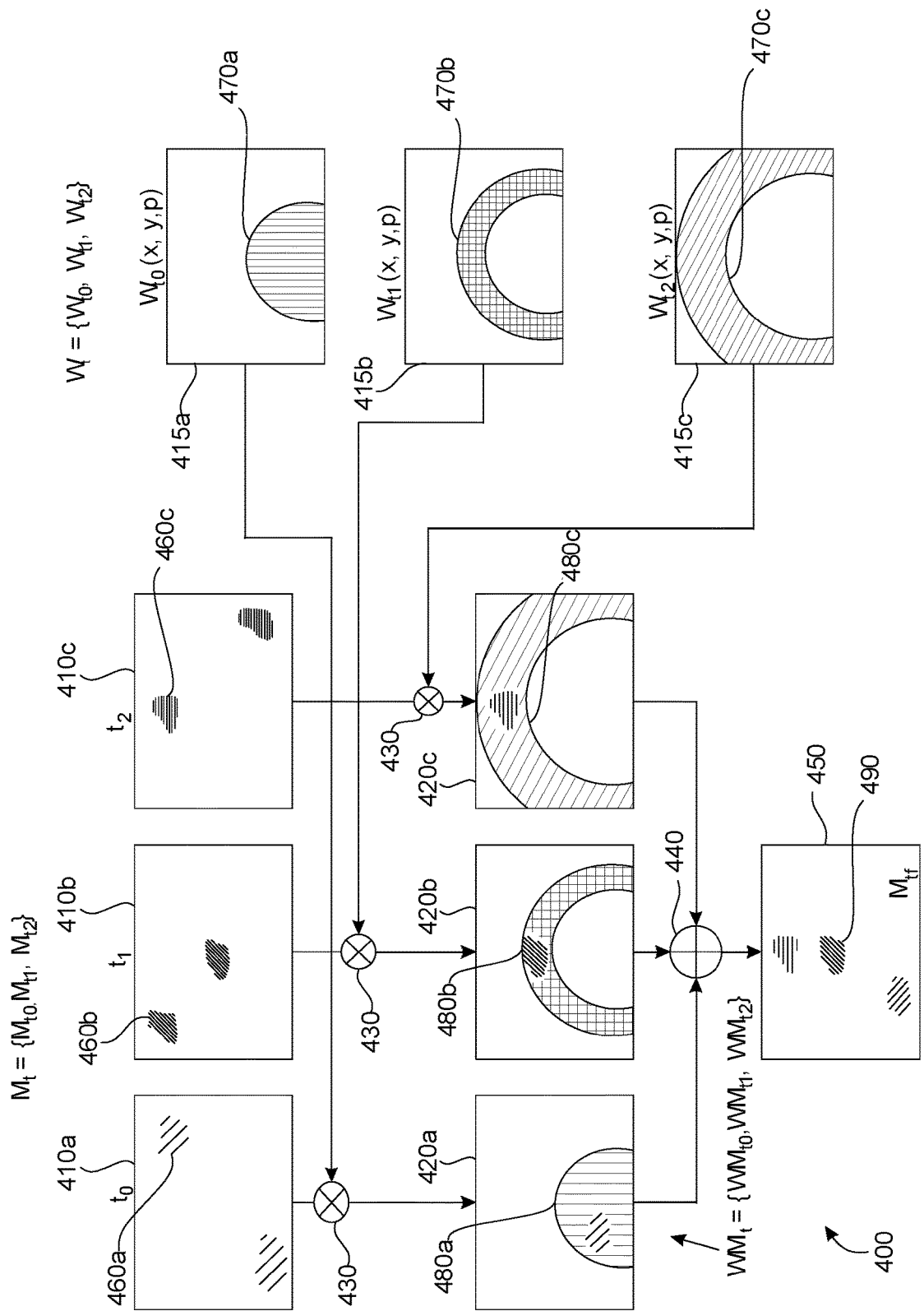
FIG. 4 is a schematic diagram according to one example embodiment, illustrating an example generation of a final occupancy grid map (OGM) based on a set of predicted OGMs and a set of weight maps.

As shown in FIG. 3, the OGM merger module 351 receives a set of predicted OGMs $M_t=\{M_{t0}, M_{t1}, M_{tn}\}$ 410a, 410b, 410c from the OGM prediction module 340. Each of the predicted OGMs $M_{tx}$ is associated with a corresponding timestamp $t_x$. Each predicted OGM $M_{tx}$ includes a plurality of cells $\{m_1, m_2, \ldots m_n\}$, and each cell $m_i$ contains a respective value $P_i$ representing the probability of each cell being occupied by an object at time $t_x$, where x=0, 1, 2 . . . and so on. For example, to may represent the present time, $t_1$ may represent a time that is one unit of time further into the future compared to $t_0$ (e.g., $t_1$ is one second into the future), $t_2$ may represent a time that is two units of time further into the future compared to $t_0$ (e.g. $t_2$ is two seconds into the future), and so on. A unit of time may be one second, or any other appropriate unit (e.g. half a second) as determined or specified by the OGM prediction module 340. One or more cells in each predicted OGM 410a, 410b, 410c have a probability value $P_{i*}$ above a pre-specified threshold (e.g. 50%). The one or more cells having the value $P_{i*}$ then represent one or more geographical areas 460a, 460b, 460c likely to be occupied at the respective timestamp $t_x$. As shown in FIG. 4, area 460a is likely occupied at the present as shown in predicted OGM 410a, area 460b is likely occupied at t=$t_1$ as shown in OGM 410b, and area 460c is likely occupied at t=$t_2$ as shown in the predicted OGM 410c. The predicted OGMs 410a, 410b, 410c generally represent the physical environment in which the vehicle 100 is operating at a particular point in time.

In addition, the OGM merger module 351 receives a set of weight maps $W_t=\{W_{t0}, W_{t1}, \ldots, W_{tm}\}$ from a weight map module 353. Each weight map $W_{tx}$ is associated with a corresponding timestamp $t_x$. As shown in FIG. 4, one or more weight maps $W_{tx}$ 415a, 415b, 415c is generated based on kinodynamic parameters, such as velocity and orientation, of the vehicle 100. A weight map $W_{tx}$ 415a, 415b, 415c represents a geographic weight region 470a, 470b, 470c which the vehicle 100 can potentially reach at the corresponding time $t_x$, where x=0, 1, 2 . . . and so on. For example, to may represent the present time, $t_1$ may represent a time that is one unit of time further into the future compared to $t_0$ (e.g., $t_1$ is one second into the future), $t_2$ may represent a time that is two units of time further into the future compared to $t_0$ (e.g. $t_2$ is two seconds into the future), and so on. A unit of time may be one second, or any other appropriate unit (e.g. half a second) as determined or specified by the weight map module 353.

In some example embodiments, each of the weight map $W_{tx}$ 415a, 415b, 415c is determined by three variables {x, y, p}, where x and y may be values based on coordinates of a vehicle 100 on a map, and p may be one or more variables, such as velocity, acceleration, jerk, curvature, orientation, and so on. In some cases, one or more generated trajectories T may be received from the trajectory generator 360 and used to calculate or refine a weight map.

In some embodiments, weight maps can be generated based on for example {x, y, v} or {x, y, v, a}, where v and a each represents the velocity and acceleration of the vehicle, respectively. In some embodiments, a trajectory may be used to generate the weight map $W_{tx}$ {x, y, τ, ϵ}, where τ is the trajectory, and E is the trajectory following error distribution of the vehicle control system 140. The trajectory τ may be for example a generated trajectory T from the trajectory generator 360. A trajectory (i.e., path) τ contains target points with target velocity, acceleration, jerk, orientation, and curvature at each point. The vehicle control system 140 may control the vehicle 100 to follow the trajectory τ with some level of accuracy. Therefore, the trajectory τ can be used t0, based on some probability of controller accuracy, calculate the whereabouts of the vehicle over time, which can directly be used in generating weight maps. For example, in discrete weight maps, the trajectory can be used to find the boundaries of weight map $W_{tx}$ for each timestamp tx.

Figure 5:
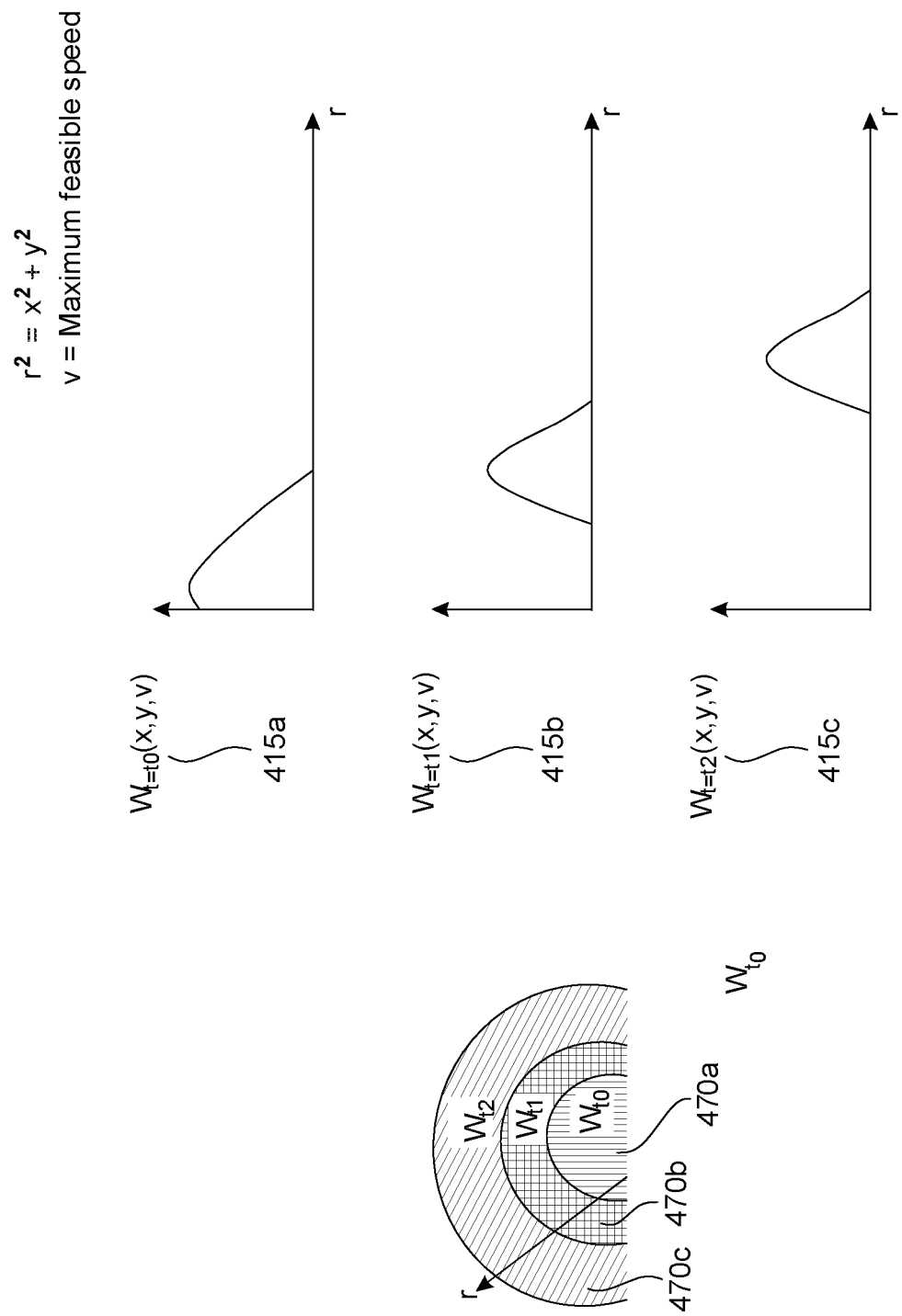
FIG. 5 is a schematic diagram according to one example embodiment, illustrating an example generation of a set of weight maps.

FIG. 5 shows example embodiments of a weight map $W_{tx}$ calculated based on x, y and v, where x and y refers to coordinates of a vehicle 100 on a map, and v refers to a maximum feasible velocity of the vehicle 100. In this case, the weight map is a function of r, where $r^2=x^2+y^2$. At $t=t_0$, which is the present, $x_{r0}$ and $y_{r0}$ may be a value calculated based on the current coordinates of the vehicle 100 on the map. At time $t=t_0$, which is the present time, the vehicle 100 may be at coordinates (0,0), $x_{r0}$ is the distance between the front of the vehicle 100 to coordinates (0,0) on the map along the x-axis and $y_{r0}$ may be a distance from the front of the vehicle to coordinates (0,0) along the y-axis. A padding may be added to the value of $x_{r0}$ and $y_{r0}$ in some cases as a safety measure. Radius $r_{r0}$ is then calculated based on the equation $r^2=x^2+y^2$. $W_{r0}$ is then calculated based on $r_{r0}$. Weight map $W_{r0}$ has a geographic weight region 470a which represents an area the vehicle 100 can possibly reach (or occupy) at time $t=t_0$.

At $t=t_1$, $x_{r1}$ and $y_{r1}$ may be determined based on an updated set of coordinates (a, b), where a represents the furthest possible point along x-axis to which the vehicle 100 can travel at time $t_1$ based on the maximum feasible velocity v, and b represents the furthest possible point along y-axis to which the vehicle 100 can travel at time $t_1$ based on the maximum feasible velocity v. $x_{r1}$ is the distance between $x_{r0}$ and a, and $y_{r1}$ is the distance between $y_{r0}$ and b. A weight map $W_{r1}$ is then calculated based on $r_{r1}$ at time $t_1$, using the equation $r^2=x^2+y^2$. Weight map $W_{r1}$ has a geographic weight region 470b which represents an area the vehicle 100 can possibly reach (or occupy) at time $t=t_1$. As seen in FIG. 5, region 470b is adjacent to region 470a, as the vehicle 100 continuously moves on the road.

Similarly, $W_{r2}$, $W_{r3}$ . . . $W_{rn}$ can be calculated at a respective timestamp $t_x$, where x=2, 3, . . . n. The maximum feasible speed v can be obtained from the sensor system 110.

In some embodiments, the weight maps $W_{tx}$ 415a, 415b, 415c are calculated at discrete points in time such as at $t=t_0$, $t_1$, and $t_2$. In other embodiments, the weight maps may be calculated continuously and represented as a function of time t. One example is to extend FIG. 5 to a continuous case as follows:

Let v be the current speed of the vehicle. The weight map is defined as follows:

$$W(t, x, y, v) = c_0 e^{-c_1(t-t_k)} e^{-c_2\left(\sqrt{x^2+y^2} - t_k v\right)}$$

Where $t_k$, k={0, 1, 2, . . . } are timestamps associated with the nominal (predefined) time horizon of predicted OGMs. The benefits of this is that if there are any latency in predicted OGMs, W(t,x,y,v) can be sampled based on the timestamp of the OGMs, and the sampled weight maps can be applied to its corresponding OGM. For example, the OGM prediction module 340 may be designed to generate predictive OGMs for $t_k$={0.0,1.0,2.0,3.0}, but in practice the OGM processor module 350 may receive the OGMs with some delays due to communication latency or delay in processing in modules 340. In this case, the OGM processor module 350 may receive predictive OGMs with $t_k$={0.1, 1.05,2.2,3.15} timestamps, which can be used to sample W (t,x,y,v) and those samples can be applied to their corresponding OGM.

Referring back to FIG. 4, each of the respective OGM maps $M_{tx}$ 410a, 410b, 410c may be filtered by a respective weight map $W_{tx}$ 415a, 415b, 415c, at a corresponding timestamp $t=t_0$, $t_1$, $t_2$ to obtain a corresponding filtered or weighted predicted OGM $WM_{t0}$ 420a, $WM_{t1}$ 420b, $WM_{t2}$ 420c. In some example embodiments, the filtering operation 430 may be one of a Gaussian filter and a Bayesian filter. Each of the resulting weighted predicted OGMs $WM_t=\{WM_{t0}, WM_{t1}, WM_{t2}\}$ 420a, 420b, 420c has a filtered region 480a, 480b, 480c. Each filtered region 480a, 480c, 480c shows an overlapped area between occupied cells of the original predicted OGMs $M_{tx}$ and weight maps $W_{tx}$. The resulting weighted predicted OGMs $WM_t$ are merged into a final predicted 2D OGM $M_{tf}$ 450 with a summation operation 440. The final predicted 2D OGM $M_{tf}$ 450 shows one or more cells 490 likely to be occupied by one or more objects including the vehicle 100. The final predicted 2D OGM $M_{tf}$ 450 is predictive in nature as it includes filtered information from the original 3D predicted OGM $M_{tx}$ 410a, 410b, 410c, which has taken potential future movements of objects into consideration.

Figure 6A:
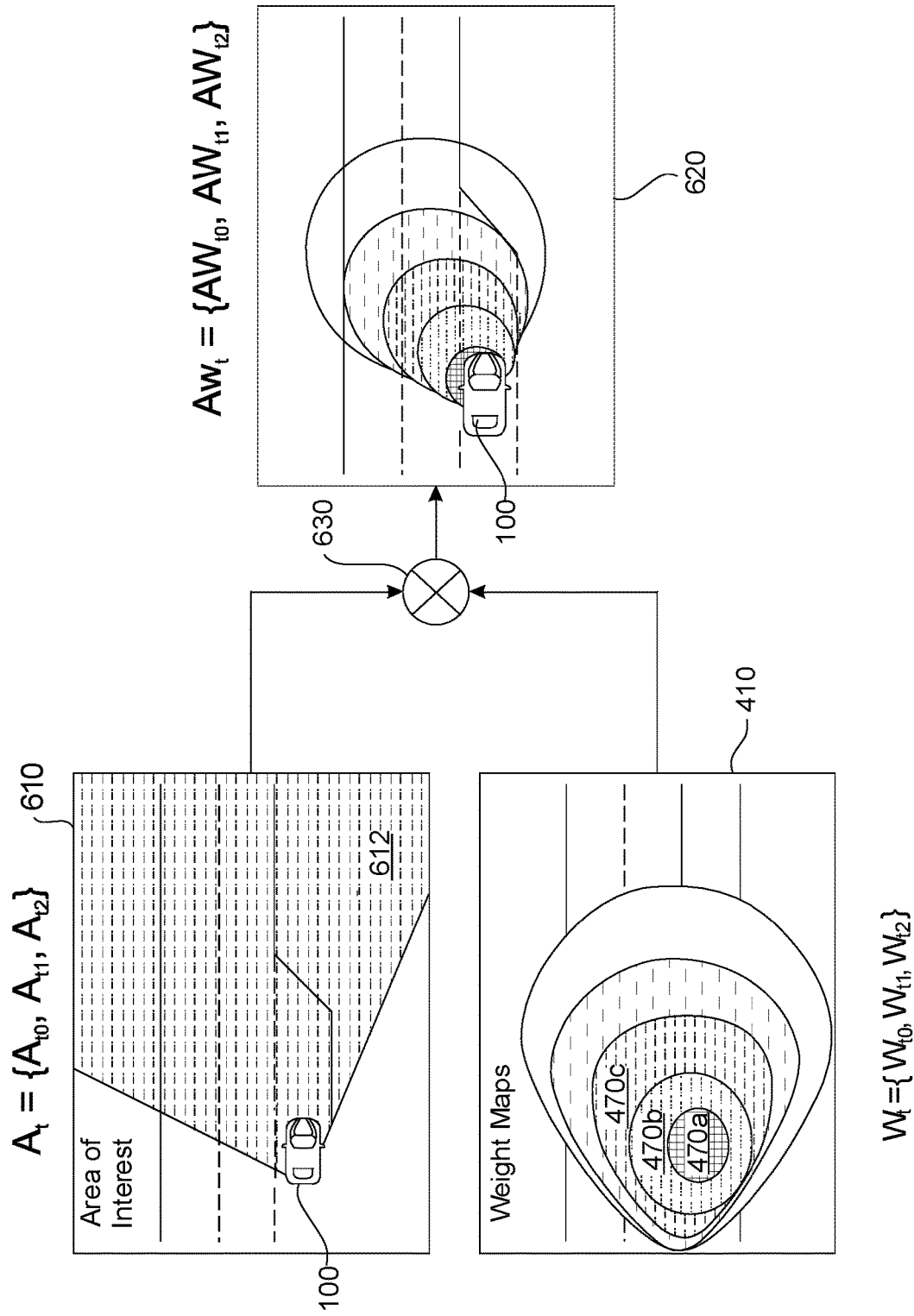
FIG. 6A is a schematic diagram according to one example embodiment, illustrating an example generation of an area weight map based on a weight map and an area of interest map.

As shown in FIG. 6A, in addition to weight maps $W_{tx}$ 415a, 415b, 415c, one or more area of interest maps $A_t=\{A_{t0}, A_{t1}, A_{t2}\}$ 610 may be used to filter a set of predicted OGMs $M_{tx}$ 410a, 410b, 410c. The area of interest maps $A_t = \{A_{t0}, A_{t1}, A_{t2}\}$ 610 may be used to filter the weight maps $W_{tx}$ 415a, 415b, 415c as well.

An area of interest map 610 is a map that is determined based on at least a behavior decision or command B from the BP module 320. For example, if the behavior command B for the vehicle 100 is to switch to the left lane, the area of interest map 610 may have an area of interest region 612 representing an area into which the vehicle 100 is likely going, as shown in FIG. 6A. In this case, the area of interest map 610 covers more areas on the left side of the vehicle 100 as the task involves switching lane. In some embodiments, the area of interest region 612 can be defined based on where the front half of the vehicle 100 is, or is likely to be, at a given point in time, assuming the vehicle is moving forward.

FIG. 6A shows three area of interest maps $A_t = \{A_{t0}, A_{t1}, A_{t2}\}$ 610 being used to filter a set of weight maps $W_t = \{W_{t0}, W_{t1}, W_{t2}\}$ 415a, 415b, 415c to obtain a set of weighed area maps $AW_t = \{AW_{t0}, AW_{t1}, AW_{t2}\}$, which are then summed up using a summation operation to obtain a weighted area map 620 showing where the vehicle 100 is likely going to be at time $t=t_0$, $t_1$ and $t_2$. During this process, each area of interest map $A_{tx}$ is used in a filtering operation 630 to filter a corresponding weight map $W_{tx}$, where x=1, 2, and 3. In some example embodiments, the filtering operation 430 may be one of a Gaussian filter and a Bayesian filter.

In some example embodiments, the area of interest maps $A_t = \{A_{t0}, A_{t1}, A_{t2}\}$ 610 can first be applied to filter the set of predicted OGMs $M_{tx}$ 410a, 410b, 410c, to increase the relative importance of occupied cells within the area of interest maps $A_t = \{A_{t0}, A_{t1}, A_{t2}\}$. Then, weight maps $W_t = \{W_{t0}, W_{t1}, W_{t2}\}$ 415a, 415b, 415c are applied to the resulting filtered predicted OGMs, which are added together to generate a final predicted 2D OGM $M_{tf}$ 450. The area of interest map $A_{tx}$ may differ from one task to another. For example, for a switch lane task, more weights can be assigned to cells on the adjacent lane that the vehicle is about to switch into. For another example, for a keep lane task, more weights can be assigned to the current lane.

Once generated by OGM merger 351, the final predicted 2D OGM $M_{tf}$ 450 is then transmitted by the OGM processor module 350 to the trajectory generator 360, which generates or retrieves a feasible and collision-free trajectory T based on the final OGM $M_{tf}$ 450. The trajectory generator 360 can use a number of methods to generate the final trajectory T. For example, the trajectory generator 360 can generate a set of pre-generated candidate trajectories based on the behavior command B and kinodynamic parameters of the vehicle 100, and select, from among the candidate trajectories, a single specific trajectory T evaluated to be good or otherwise appropriate for execution. For another example, the trajectory generator 360 can generate a single trajectory by searching over the final, single 2D predicted OGM $M_{tf}$ 450. Some example OGM-based techniques to generate trajectory includes: skeleton method, A*, hybrid A*, RRT, PRM, DRT, Roadmaps, Voronoi diagrams, and so on. The resulting 2D OGM can also be used in non-OGM based methods for collision checks and filtering trajectories in sampling-based motion planning methods.

There are a number of advantages associated with the proposed methods as performed by OGM processor module 350. By processing multiple 3D predicted OGMs, which are associated with different timestamps including future timestamps, into a single 2D predicted OGM, the path planning method is a predictive 2D path planning method rather than a 3D path method, which is significantly less computational complex. The proposed OGM processor module 350 is capable of handling dynamic environments in an efficient and real-time manner, which has long been a challenge faced by traditional path planning methods. In addition, by using a single 2D predicted OGM to generate a trajectory, it is now possible to achieve a constant-time collision check as the processing time for generating the single trajectory does not depend on the number of objects present on the scene, and no further motion prediction for objects is required. In comparison, traditional methods for generating a path trajectory typically need to loop over objects and the associated processing time for generating the path trajectory is proportional to the number of objects in the scene, and thus the processing time in these traditional methods tends to be non-constant.

By decoupling OGM-processing from trajectory generation, the OGM processor module 350 is largely agnostic to the specific method used for path planning and trajectory generation. As such, it is now possible for the trajectory generator 360 to use any suitable path planning method(s) for trajectory generation, without having to depend on the OGM processor module 350 for every step along the way to generate a final trajectory.

The use of a predicted OGM such as the final 2D predicted OGM $M_{tf}$ 450 provides a higher degree of reliability for path planning in dynamic environments, compared to padding-based approaches, as the estimated whereabouts and information of dynamic objects can be used in both trajectory generation and collision-check processes. Since a predicted OGM takes potential movements of dynamic objects into consideration, it provides a higher degree of robustness in path planning, compared to other methods that require regular and rapid re-planning in dynamic environments.

Figure 6C:
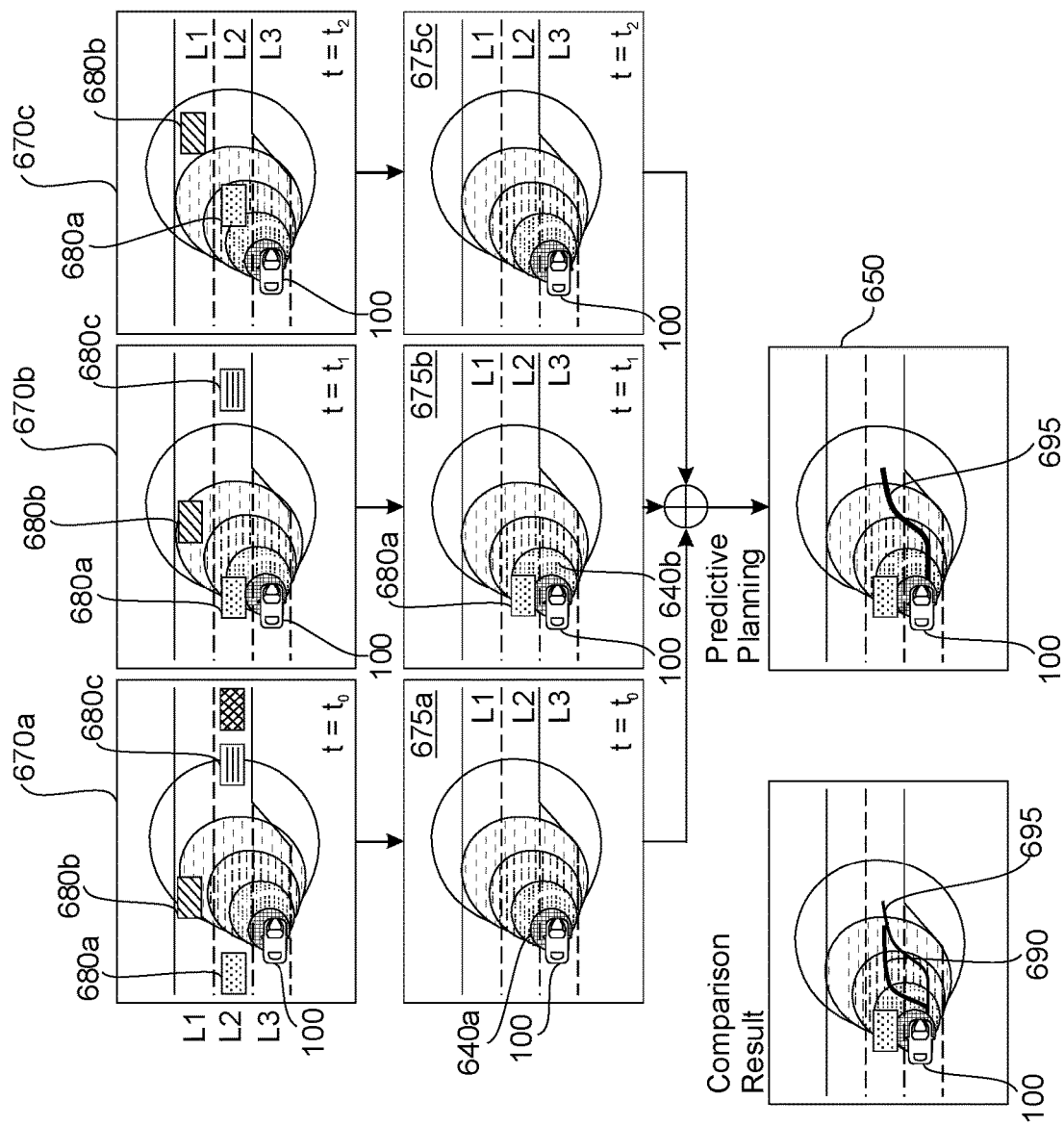
FIGS. 6B and 6C show multiple schematic diagrams, illustrating a predictive path planning according to one example embodiment and a non-predictive path planning in comparison.
Figure 6B:
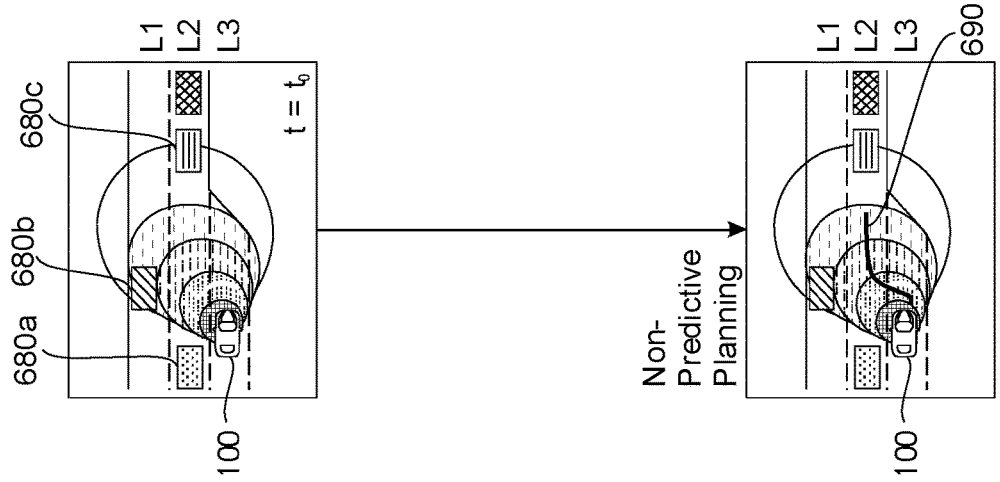

Some specific planning examples will now be described to facilitate an understating of possible applications of the planning system 130 and in particular how the OGM processor module 350 may improve system operation. One intended application of the planning system 130 is in multi-lane driving for driving in structured and lane-based scenarios such as highways or urban roads, where change lane and keep lane behaviors are expected to reach to some target goals determined by a mission planner. FIGS. 6B and 6C each illustrates an example of a vehicle 100 driving and merging into traffic 680a, 680b, 680c in an operating space that includes multiple parallel driving lanes L1, L2, L3. In this scenario, the vehicle 100 is trying to move from L3 into L2. Multiple moving objects including cars 680a, 680b, 680c need to be avoided for the vehicle 100 to safely merge into the traffic. FIG. 6B illustrates an example where only a current OGM, which only contains information associated with the present, is used to generate a trajectory 690. The final trajectory 690 generated by the trajectory generator 360 seemingly avoids all traffic during the merging operation (which is similar to a switch-lane operation).

FIG. 6C illustrates an example where a set of predicted OGMs $M_t = \{M_{t0}, M_{t1}, M_{t2}\}$ 410 are processed (e.g. filtered) by the OGM merger module 351 with weight maps 415 and area of interest maps 610 to generate a set of filtered predicted OGMs 670a, 670b, 670c, which at each point in time $t=t_0$, $t_1$ or $t_2$, takes into consideration where other moving objects 680a, 680b, 680c might be. The filtered predicted OGMs 670a, 670b, 670c are then processed to generate pre-summation predicted OGMs 675a, 675b, 675c, which only show the moving object(s) that appear in a relevant weight region 640 at a point in time. For example, at $t=t_0$, which is the present, the vehicle 100 in pre-summation predicted OGM 675a is only concerned with a weight region 640a, which covers the region the vehicle 100 can possibly reach at a maximum feasible velocity, and also taking the behavior decision of traffic-merging (or lane-switching) into consideration, as described above in reference to FIG. 6A. Because none of the objects 680a, 680b, 680c is within weight region 640a at this point, the OGM merger module 351 can disregard the moving objects 680a, 680b, 680c at t=$t_0$. At t=$t_1$, which is one unit of time (e.g. 1 second) into the future, the vehicle 100 in the pre-summation OGM 675b is only concerned with a weight region 640b, which covers the region the vehicle 100 can possibly reach at a maximum feasible velocity, and also taking the behavior decision of traffic-merging (or lane-switching) into consideration. In this case, because only object 680a is in region 640b, the OGM merger module 351 can disregard the other moving objects 680b, 680c at t=$t_1$. At t=$t_2$, which is two unit of time (e.g. 2 seconds) into the future, the vehicle 100 in map 675c is only concerned with a weight region 640c, which covers the region the vehicle 100 can possibly reach at a maximum feasible velocity, and also taking the behavior decision of traffic-merging (or lane-switching) into consideration.

Next, the pre-summation OGMs 675a, 675b, 675c are processed in a summation operation to generate a final predicted 2D OGM 650, which is then sent to the trajectory generator module 360 to generate a final predictive trajectory 695. Comparing the predictive trajectory 695 to the non-predictive trajectory 690, it is readily clear that trajectory 695 is safer and leaves room for object 680a to move ahead before merging into traffic.

One advantage of this embodiment is that the path planning system 130 of generates a safe trajectory when the vehicle 100 is operating in a multi-lane highway and the vehicle 100 is required to merge into another lane because the lane the vehicle 100 is operating in ends. This embodiment does not require 3D spatiotemporal path planning or conservative padding to deal with dynamic vehicles/obstacles in the current lane the vehicle 100 is operating in and adjacent lanes to the current lane. Also, the path planning system 130 can re-plan the trajectory less frequently because the estimated future location of other vehicles or objects are reflected in the final predicted 2D OGM 650.

Figure 7:
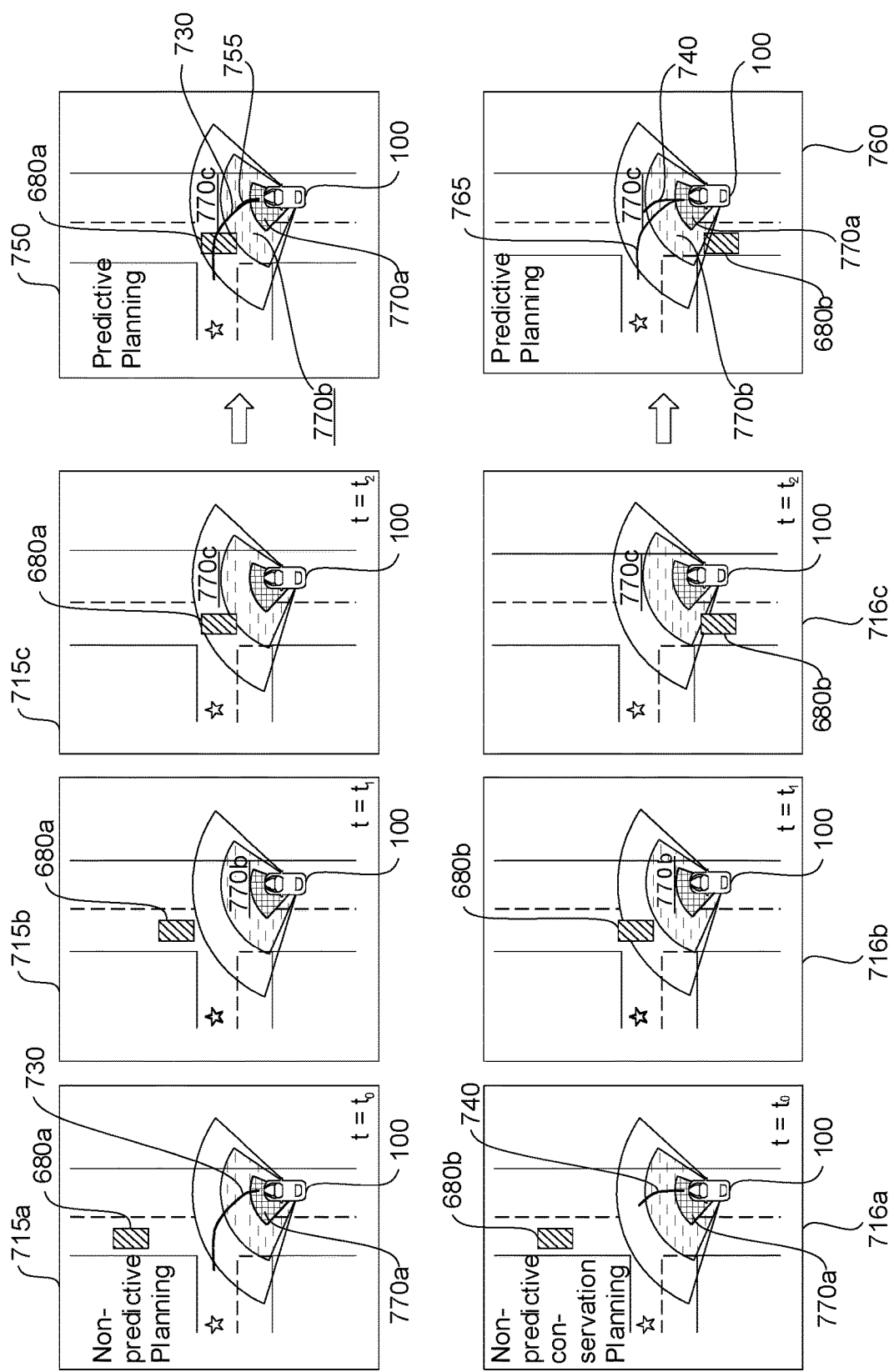
FIG. 7 are sets of plan views of two examples of an autonomous vehicle within an operating space, illustrating a turning behavior at an intersection.

FIG. 7 illustrates two examples of the vehicle 100 within an operating space, illustrating an unprotected left turn at an intersection. In this example, the OGM processor module 350 receives and filters a set of predicted OGMs with a combination of weight maps and area of interest maps to generate a set of filtered predicted OGMs 715a-c, 716a-c, which are then processed using a summation operation to generate final 2D predicted OGMs 750, 760. Top row of FIG. 7 shows a scenario where the incoming traffic 680a is going to be in the middle of the intersection when the vehicle 100 is about to make a left turn. Each filtered predicted OGM 715a, 715b, 715c has a timestamp t, where t is $t_0$, $t_1$ or $t_2$; and at each point in time, a respective weight region 770a, 770b, 770c is considered. The final predicted 2D OGM 750 shows that the traffic 680a is going to be in the path of the left turn, as the traffic 680a is predicted to be in a weight region 770c that is associated with t=$t_2$. Bottom row of FIG. 7 shows a scenario where the incoming traffic 680b is going to travel past the intersection when the vehicle 100 is about to make a left turn. Each filtered predicted OGM 716a, 716b, 716c has a timestamp t, where t is $t_0$, $t_1$ or $t_2$, and at each point in time, a relevant weight region 770a, 770b, 770c is considered. The final 2D predicted OGM 760 shows that the traffic 680b is going to be past the intersection and traveling away at t=$t_2$.

Each respective final predicted 2D OGM 750, 760 is used to generate a respective trajectory 755, 765 for the left-turn behavior. Depending on the final predicted 2D OGM 750, 760, the trajectory generator module 360 may choose a shorter trajectory 755 to stop at the middle of road to give yield to the incoming traffic (top row in FIG. 7) if the final predictive 2D OGM 750 shows that object 680a is likely in the way of the left-turn path, or generate a trajectory 765 to complete the left-turn task if there is no obstructing traffic in the final predicted 2D OGM 760, when the object 680a is traveling at a faster speed than the object 680a (bottom row in FIG. 7). Without predictive path planning, and using only a current observed OGM 715a, 716a, the system may generate a trajectory 730 that may hit the incoming traffic 680a, or a trajectory 740 that is too conservative.

This example provides an efficient and non-conservative approach to deal with left turn scenario. The OGM merger module 351 generates a final predicted 2D OGM, which is used by the trajectory generator illustrates that the path planning system 130 generates a trajectory 360 of the path planning system 130 to generate a trajectory that results in smoother and safer driving.

Figure 8A:
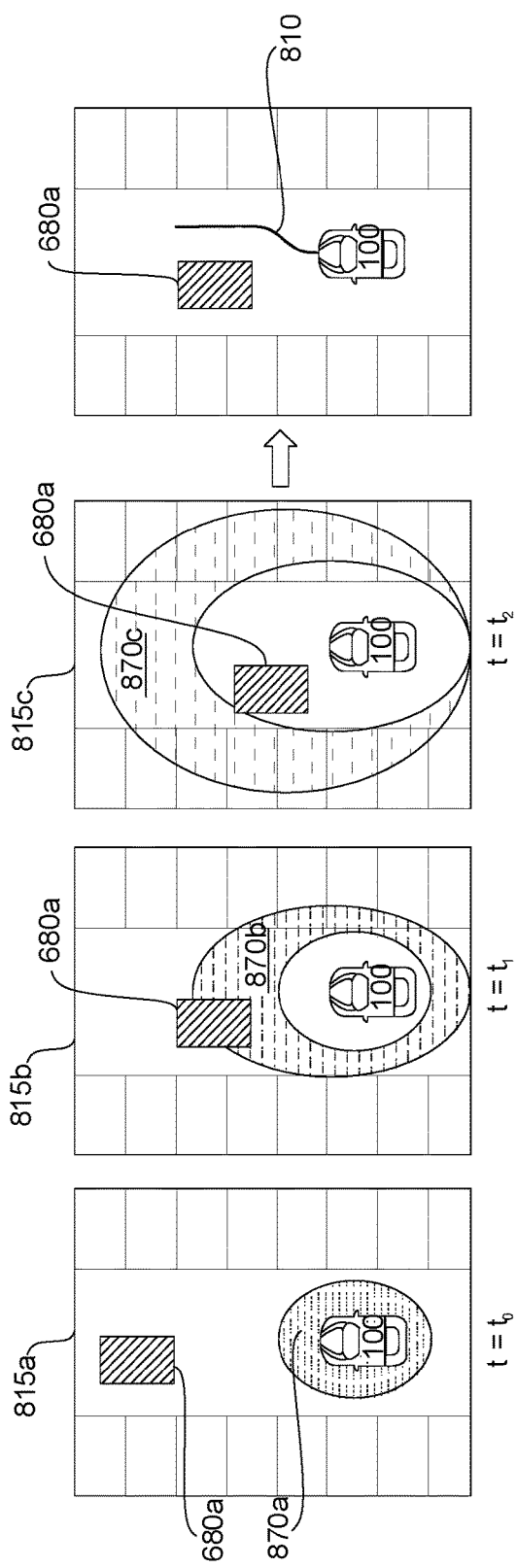
FIGS. 8A and 8B are sets of plan views showing two examples of an autonomous vehicle within an operating space, illustrating a behavior to avoid a possible collision with an incoming vehicle.
Figure 8B:
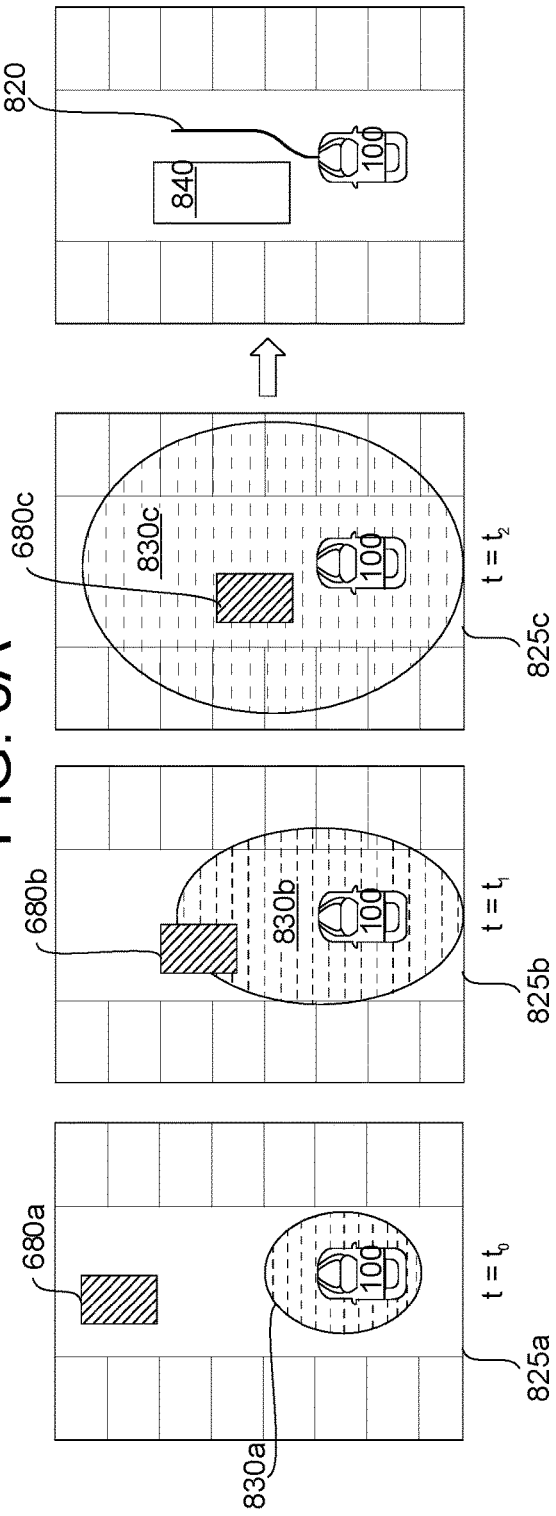

FIGS. 8A and 8B are sets of plan views showing two examples of the vehicle 100 within an operating space, illustrating a behavior to avoid a possible collision with an incoming vehicle 680a. One example application of an example embodiment is when the vehicle 100 is operating in semi-structured or in unstructured open areas, such as parking lots, areas without lane markings, shared roads, or areas with unclear lane separation. FIG. 8A shows a driving scenario in a semi-structured or in unstructured open area, where vehicles 100, 680a share the road or driving area. A set of weight maps each with a weight region 870a, 870b, 870c (corresponding to t=$t_0$, $t_1$, $t_2$ respectively) may be used to filter the predicted OGMs to generate filtered predicted OGMs 815a, 815b, 815c, which are summed to generate the final predicted 2D OGM. The trajectory 810 is generated based on the final predicted 2D OGM. As shown, the trajectory 810 factors in incoming traffic 680a ahead of time and causes the vehicle 100 to move to the side of the road if necessary. This helps in avoiding blocking situations, where the vehicle 100 may be forced to reverse.

A weight map definition has the flexibility of being realized through a) exclusive sub-zones (FIG. 8A), b) semi-inclusive (FIG. 8B) or c) inclusive (FIG. 9) zones with variable densities. In exclusive zones shown in FIG. 8A, the predicted OGMs are uniformly filtered out based on the corresponding weight maps. For example, each OGM from the predicted set of OGMs can be an input to the OGM processor module 350 and filtered accordingly. In semi-inclusive or inclusive zones, the predicted OGMs are filtered more smoothly and scaled to take advantage of all available information embedded in the predicted OGMs. Moreover, the density of weight maps and distributions can be adjusted based on driving tasks for the vehicle 100, the type of environment (highway, parking lot, low/high speed roads, low/high density environments), or weather conditions in which the vehicle 100 is operating in for a more conservative planning or to adjust a coverage. For example, FIG. 8B shows a set of filtered predicted OGMs 825a, 825b, 825c, each having a respective weight region 830a, 830b, 830c. The weight region 830b for t=$t_1$ includes the weight region 830a for t=$t_0$, and the weight region 830c at t=$t_2$ includes the weight region 830b for t=$t_1$. The moving object 680c is shown to be entirely within the weight region 830c at t=$t_2$, and the final trajectory 820 causes the vehicle 100 to avoid incoming traffic 840 at an earlier stage compared to the path 810 shown in FIG. 8A.

Figure 9:
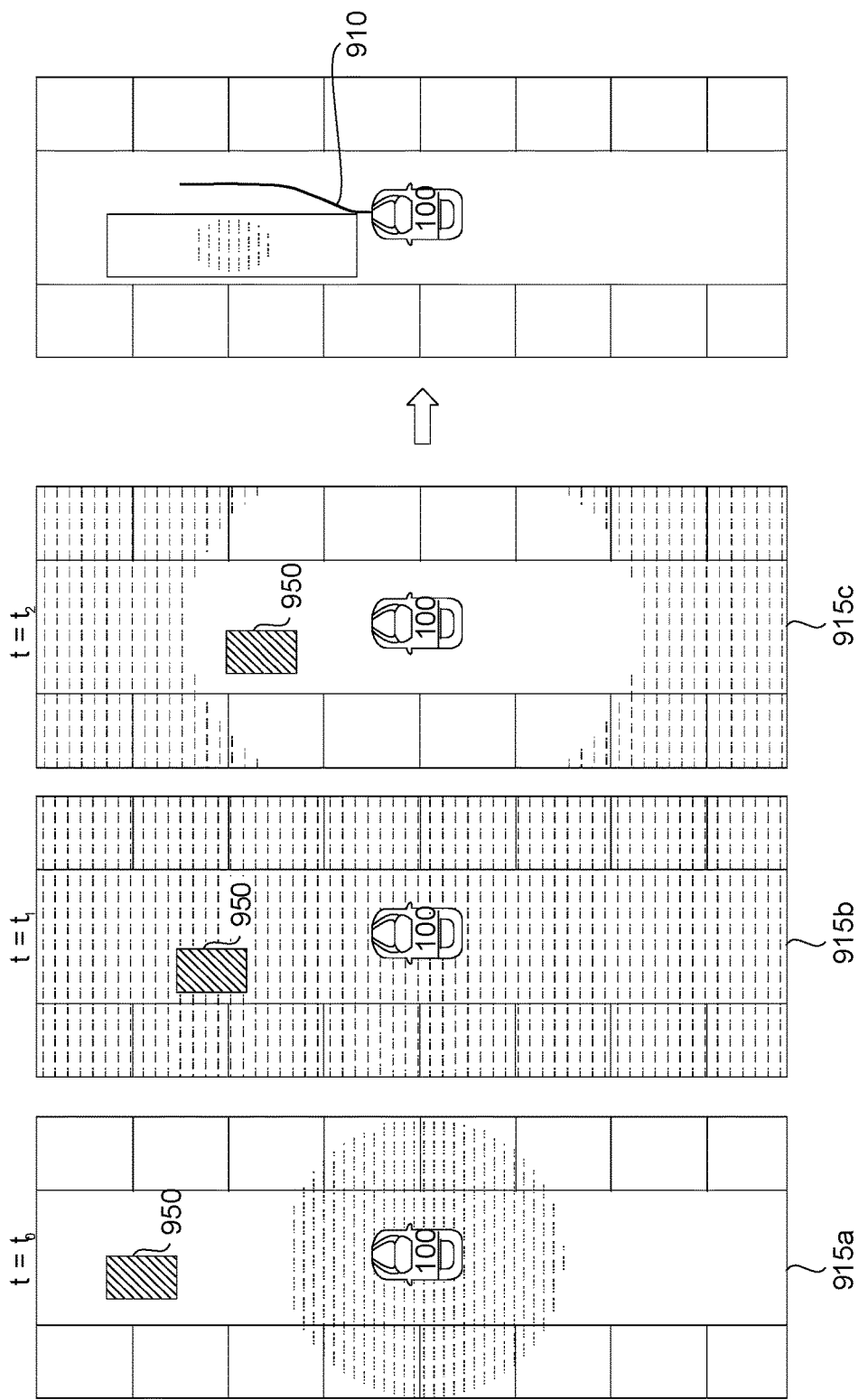
FIG. 9 is a set of plan views showing an example of an autonomous vehicle within an operating space, illustrating another behavior to avoid a possible collision with an incoming vehicle.

FIG. 9 is a set of plan views showing an example of the autonomous vehicle 100 within an operating space, illustrating another behavior to avoid a possible collision with an incoming vehicle 950. In this example, the weight maps are fuzzy weight maps, resulting in fuzzy filtered maps 915*a*, 915*b*, 915*c*. A final trajectory 910 is generated based on a final predicted 2D OGM, which is the summation of the filtered predicted OGMs 915*a*, 915*b*, 915*c*. One advantage of using fuzzy weight maps is that it facilitates path planning for unstructured environment, since the fuzzy weight maps do not require any lane marking or road structure information. The example illustrates the flexibility of the OGM processor module 350 in terms of providing fuzzy weight maps to adjust the conservativeness and coverage of the resulting final predicted 2D OGM.

FIG. 10 is a flowchart illustrating an example method 1000 performed by the OGM processor module 350 of the path planning system 130 for processing a set of predicted OGMs to generate a single predicted OGM and a trajectory T based on a single predicted OGM. At step 1010, the OGM processor module 350 receives a set of predicted Occupancy Grid Maps (OGMs), which may include a current predicted OGM and one or more future predicted OGMs, the current OGM associated with a current timestamp and each future predicted OGM associated with a future timestamp. At step 1020, the OGM processor module 350 generates a set of weight maps based on one or more kinodynamic parameters of the vehicle 100, the set of weight maps including a weight map associated with the current timestamp based on one or more kinodynamic parameters of the vehicle at the current time stamp, and one or more weight map associated with a future timestamp based on one or more kinodynamic parameters of the vehicle at the respective future timestamp. At step 1030, the OGM processor module 350 generates a set of filtered predicted OGMs by filtering the current predicted OGM with the weight map associated the current timestamp and filtering each respective future predicted OGM associated with a future timestamp with the weight map associated with the respective future timestamp. At step 1040, the OGM processor module 350 generates a single predicted OGM representative of the set of filtered predicted OGMs to a trajectory generator, the single predicted OGM generated by combining the filtered predicted OGMs in the set of filtered OGMs. At step 1050, the OGM processor module 350 generates a trajectory T based on the single predicted OGM.

The one or more kinodynamic parameters can include at least one of: a linear speed, an acceleration or deceleration, a travel direction, an angular acceleration, pitch, yaw, roll, vibration, an engine RPM, a throttle position, a brake position, a transmission gear ratio, a maximum rotation speed of the steering wheel of the vehicle, a kinematic model of the vehicle, a width of the vehicle, a length of the vehicle, and a minimum turning radius.

The generated trajectory T may be outputted to control the vehicle 100. For example, the generated trajectory T may be provided to the vehicle control system 140, which in turn outputs control commands to the electromechanical system 150, to cause the vehicle 100 to execute the generated trajectory T. In some examples, the method 1000 may include the action to execute the generated trajectory T.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A processor-implemented method of motion planning for an autonomous vehicle, the method comprising:
    receiving a set of predicted occupancy grid maps (OGMs), the set of predicted OGMs including a current predicted OGM and one or more future predicted OGMs, the current predicted OGM associated with a current timestamp and each future predicted OGM associated with a respective future timestamp;
    generating a current weight map associated with the current timestamp based on one or more kinodynamic parameters of the autonomous vehicle at the current timestamp and a future weight map associated with each respective future timestamp based on one or more kinodynamic parameters of the autonomous vehicle at the respective future timestamp;
    generating a set of filtered predicted OGMs by filtering the current predicted OGM with the current weight map associated with the current timestamp to generate a filtered current predicted OGM and filtering each future predicted OGM with the future weight map associated with the respective future timestamp to generate one or more filtered future predicted OGMs;
    generating a single predicted OGM representative of the set of filtered predicted OGMs by combining the filtered current predicted OGM and each filtered future predicted OGM in the set of filtered predicted OGMs; and generating a trajectory for the autonomous vehicle to follow based on the single predicted OGM.

2. The method of claim 1, wherein filtering the respective predicted OGMs in the set of predicted OGMs comprises performing one of: a Gaussian filtering operation; and a Bayesian filtering operation.

3. The method of claim 1, further comprising:
generating a set of area of interest maps based on a behavior command received from a behavior planning module, wherein the set of area of interest maps includes a current area of interest map associated with the current timestamp and a future area of interest map associated with each respective future timestamp.

4. The method of claim 3, further comprising:
filtering the current predicted OGM with the current area of interest map and filtering each future predicted OGM with a respective future area of interest map.

5. The method of claim 3, further comprising:
filtering the current weight map with the current area of interest map and filtering each future weight map with a respective future area of interest map.

6. The method of claim 3, further comprising:
filtering the filtered current predicted OGM with the current area of interest map and filtering each filtered future predicted OGM with a respective future area of interest map.

7. The method of claim 1, wherein each weight map has a respective weight region associated with the corresponding timestamp, the weight region being constructed to represent a maximum area that the vehicle can reach within a margin of safety at the corresponding timestamp, and the weight region is calculated based on a maximum feasible speed and acceleration of the vehicle.

8. The method of claim 1, wherein the one or more kinodynamic parameters comprise at least one of: a linear speed, an acceleration or deceleration, a travel direction, an angular acceleration, pitch, yaw, roll, vibration, an engine RPM, a throttle position, a brake position, a transmission gear ratio, a maximum rotation speed of a steering wheel of the vehicle, a kinematic model of the vehicle, a width of the vehicle, a length of the vehicle, and a minimum turning radius.

9. A processing system comprising:
a processor; and
a memory storing instructions which, in response to execution by the processor, cause the processing system to perform motion planning for an autonomous vehicle, wherein the execution of the instructions causes the processor to:
receive a set of predicted occupancy grid maps (OGMs), the set of predicted OGMs including a current predicted OGM and one or more future predicted OGMs, the current predicted OGM associated with a current timestamp and each future predicted OGM associated with a respective future timestamp;
generate a current weight map associated with the current timestamp based on one or more kinodynamic parameters of the autonomous vehicle at the current timestamp and a future weight map associated with each respective future timestamp based on one or more kinodynamic parameters of the autonomous vehicle at the respective future timestamp;
generate a set of filtered predicted OGMs by filtering the current predicted OGM with the current weight map associated with the current timestamp to generate a filtered current predicted OGM and filtering each future predicted OGM with the future weight map associated with the respective future timestamp to generate one or more filtered future predicted OGMs;
generate a single predicted OGM representative of the set of filtered predicted OGMs by combining the filtered current predicted OGM and each filtered future predicted OGM in the set of filtered predicted OGMs; and
generate a trajectory for the autonomous vehicle to follow based on the single predicted OGM.

10. The processing system of claim 9, wherein filtering the respective predicted OGMs in the set of predicted OGMs comprises a Gaussian filtering operation or a Bayesian filtering operation.

11. The processing system of claim 9, wherein execution of the instructions by the processor causes the processor to:
generate a set of area of interest maps based on a behavior command received from a behavior planning module, wherein the set of area of interest maps includes a current area of interest map associated with the current timestamp and a future area of interest map associated with each respective future timestamp.

12. The processing system of claim 11, wherein execution of the instructions by the processor causes the processor to:
filter the current predicted OGM with the current area of interest map and filter each future predicted OGM with a respective future area of interest map.

13. The processing system of claim 11, wherein execution of the instructions by the processor causes the processor to:
filter the current weight map with the current area of interest map and filter each future weight map with a respective future area of interest map.

14. The processing system of claim 11, wherein execution of the instructions by the processor causes the processor to:
filter the filtered current predicted OGM with the current area of interest map and filter each filtered future predicted OGM with a respective future area of interest map.

15. The processing system of claim 9, wherein each weight map has a respective weight region associated with the corresponding timestamp, the weight region being constructed to represent a maximum area that the vehicle can reach within a margin of safety at the corresponding timestamp, and the weight region is calculated based on a maximum feasible speed and acceleration of the vehicle.

16. The processing system of claim 9, wherein the one or more kinodynamic parameters comprise at least one of: a linear speed, an acceleration or deceleration, a travel direction, an angular acceleration, pitch, yaw, roll, vibration, an engine RPM, a throttle position, a brake position, a transmission gear ratio, a maximum rotation speed of a steering wheel of the vehicle, a kinematic model of the vehicle, a width of the vehicle, a length of the vehicle, and a minimum turning radius.

17. A non-transitory computer-readable medium storing instructions for performing motion planning for an autonomous vehicle, wherein the instructions in response to execution by a processor of a processing system of the autonomous vehicle, cause the processor to:
receive a set of predicted occupancy grid maps (OGMs), the set of predicted OGMs including a current predicted OGM and one or more future predicted OGMs, the current predicted OGM associated with a current timestamp and each future predicted OGM associated with a respective future timestamp;
generate a current weight map associated with the current timestamp based on one or more kinodynamic parameters of the autonomous vehicle at the current timestamp and a future weight map associated with each respective future timestamp based on one or more kinodynamic parameters of the autonomous vehicle at the respective future timestamp;

generate a set of filtered predicted OGMs by filtering the current predicted OGM with the current weight map associated with the current timestamp to generate a filtered current predicted OGM and filtering each future predicted OGM with the future weight map associated with the respective future timestamp to generate one or more filtered future predicted OGMs;

generate a single predicted OGM representative of the set of filtered predicted OGMs by combining the filtered current predicted OGM and each filtered future predicted OGM in the set of filtered predicted OGMs; and generate a trajectory for the autonomous vehicle to follow based on the single predicted OGM.

18. The non-transitory computer-readable medium of claim 17, wherein the instructions, in response to execution by the processor, cause the processor to:

generate a set of area of interest maps based on a behavior command received from a behavior planning module, wherein the set of area of interest maps includes a current area of interest map associated with the current timestamp and a future area of interest map associated with each respective future timestamp.

19. The non-transitory computer-readable medium of claim 18, wherein the instructions, in response to execution by the processor, cause the processor to perform one of:

filter the current predicted OGM with the current area of interest map and filter each future predicted OGM with a respective future area of interest map;

filter the current weight map with the current area of interest map and filter each future weight map with the respective future area of interest map; and filter the filtered current predicted OGM with the current area of interest map and filter each filtered future predicted OGM with the respective future area of interest map.

20. The method of claim 1, further comprising:
controlling the autonomous vehicle based on the trajectory.

21. The method of claim 1, wherein the filtered current predicted OGM and each filtered future predicted OGM are combined to generate the single predicted OGM representative of the set of filtered predicted OGMs by a summation operation.

22. The processing system of claim 9, wherein the execution of the instructions by the processor causes the processor to:

control the autonomous vehicle based on the trajectory.

23. The non-transitory computer-readable medium of claim 17, wherein the execution of the instructions by the processor causes the processor to:

control the autonomous vehicle based on the trajectory.

* * * * *